(12) United States Patent
Chen et al.

(10) Patent No.: US 10,858,931 B2
(45) Date of Patent: Dec. 8, 2020

(54) ENHANCING RESERVOIR PRODUCTION OPTIMIZATION THROUGH INTEGRATING INTER-WELL TRACERS

(71) Applicant: Saudi Arabian Oil Company, Dhahran (SA)

(72) Inventors: Hsieh Chen, Cambridge, MA (US); Martin E. Poitzsch, Northumberland, NH (US)

(73) Assignee: Saudi Arabian Oil Company, Dhahran (SA)

(*) Notice: Subject to any disclaimer, the term of this patent is extended or adjusted under 35 U.S.C. 154(b) by 1 day.

(21) Appl. No.: 15/786,372

(22) Filed: Oct. 17, 2017

(65) Prior Publication Data
US 2019/0112914 A1 Apr. 18, 2019

(51) Int. Cl.
| | | |
|---|---|---|
| E21B 47/11 | (2012.01) | |
| E21B 47/12 | (2012.01) | |
| E21B 49/08 | (2006.01) | |
| E21B 43/16 | (2006.01) | |

(52) U.S. Cl.
CPC .............. *E21B 47/11* (2020.05); *E21B 43/16* (2013.01); *E21B 47/12* (2013.01); *E21B 49/08* (2013.01)

(58) Field of Classification Search
CPC ....... E21B 47/1015; E21B 47/12; E21B 49/08
See application file for complete search history.

(56) References Cited

U.S. PATENT DOCUMENTS

| | | | |
|---|---|---|---|
| 6,585,044 B2 * | 7/2003 | Rester .................... | E21B 47/10 166/187 |
| 7,289,942 B2 | 10/2007 | Yang et al. | |
| 7,303,006 B2 * | 12/2007 | Stone .................... | E21B 43/166 166/245 |
| 7,472,748 B2 | 1/2009 | Gdanski et al. | |
| 9,121,271 B2 * | 9/2015 | Shook .................. | E21B 47/1015 |
| 10,458,207 B1 * | 10/2019 | Matringe ............... | E21B 43/20 |
| 2011/0320128 A1 | 12/2011 | Shook | |
| 2016/0061020 A1 * | 3/2016 | Sayarpour .............. | E21B 43/14 166/250.01 |

FOREIGN PATENT DOCUMENTS

| | | |
|---|---|---|
| CA | 2997608 | 4/2017 |
| WO | 2004095259 | 11/2004 |

OTHER PUBLICATIONS

International Search Report and Written Opinion issued in International Application No. PCT/US2018/055813 dated Jan. 30, 2019, 12 pages.

* cited by examiner

*Primary Examiner* — Silvana C Runyan
(74) *Attorney, Agent, or Firm* — Fish & Richardson P.C.

(57) ABSTRACT

Historical production data associated with production of a hydrocarbon product in a reservoir is obtained. Historical tracer test data associated with the production is obtained. History matching is performed using the historical production data and the historical tracer test data to generate improved geological models. Production optimization is performed using the improved geological models, including predicting optimized controls and updating, using the predicted optimized controls, water injection rates and fluid production rates for individual injectors and producers. The predicted optimized controls are applied to the reservoir to optimize future production.

20 Claims, 15 Drawing Sheets

ENHANCING RESERVOIR PRODUCTION OPTIMIZATION THROUGH INTEGRATING INTER-WELL TRACERS

BACKGROUND

In the hydrocarbon recovery industry, various types of use of inter-well tracers can be used to qualitatively or quantitatively gauge how fluid flows through a hydrocarbon reservoir. The inter-well tracers can be features of oilfield production monitoring programs. Tracers can be injected into injection wells and recovered from production wells in order to determine well connectivity and fluid flow allocations between wells. Recovered tracers from producers (tracer breakthroughs) are extra information that complements conventionally monitored production information, such as pressure, flow rates, and water-cut conditions. The relative costs of tracers can vary depending on their type, numbers, and use. Information determined through the use of tracers can be applied to replace or augment existing techniques, such as pressure interference studies, loggings, additional well drillings, and tomography.

SUMMARY

The present disclosure describes various techniques for enhancing reservoir production optimization through integrating inter-well tracers. For example, optimized control parameters can be used directly and automatically to control water injection rates and fluid production rates when the techniques are integrated into a reservoir analysis and management system.

In an implementation, a computer-implemented method comprises: obtaining historical production data associated with production of a hydrocarbon product in a reservoir; obtaining historical tracer test data associated with the production; performing history matching using the historical production data and the historical tracer test data to generate improved geological models; performing production optimization using the improved geological models, including predicting optimized controls and updating, using the predicted optimized controls, water injection rates and fluid production rates for individual injectors and producers; and applying the predicted optimized controls to the reservoir to optimize future production.

Implementations of the described subject matter, including the previously described implementation, can be implemented using a computer-implemented method; a non-transitory, computer-readable medium storing computer-readable instructions to perform the computer-implemented method; and a computer-implemented system comprising one or more computer memory devices interoperably coupled with one or more computers and having tangible, non-transitory, machine-readable media storing instructions that, when executed by the one or more computers, perform the computer-implemented method/the computer-readable instructions stored on the non-transitory, computer-readable medium.

The subject matter described in this specification can be implemented in particular implementations, so as to realize one or more of the following advantages. First, the quality of reservoir modeling history-matching can be improved, and a richer list of attributes can be provided to constrain matches than are provided by presently-used technologies. Second, algorithms can improve the ability to do history matching using integrated production and tracer test data to generate accurate reservoir geological models with better predictive accuracy than currently provided technologies. Other advantages will be apparent to those of ordinary skill in the art.

The details of one or more implementations of the subject matter of this specification are set forth in the Detailed Description, the Claims, and the accompanying drawings. Other features, aspects, and advantages of the subject matter will become apparent from the Detailed Description, the Claims, and the accompanying drawings.

DESCRIPTION OF DRAWINGS

Like reference numbers and designations in the various drawings indicate like elements.

DETAILED DESCRIPTION

Figure 1:
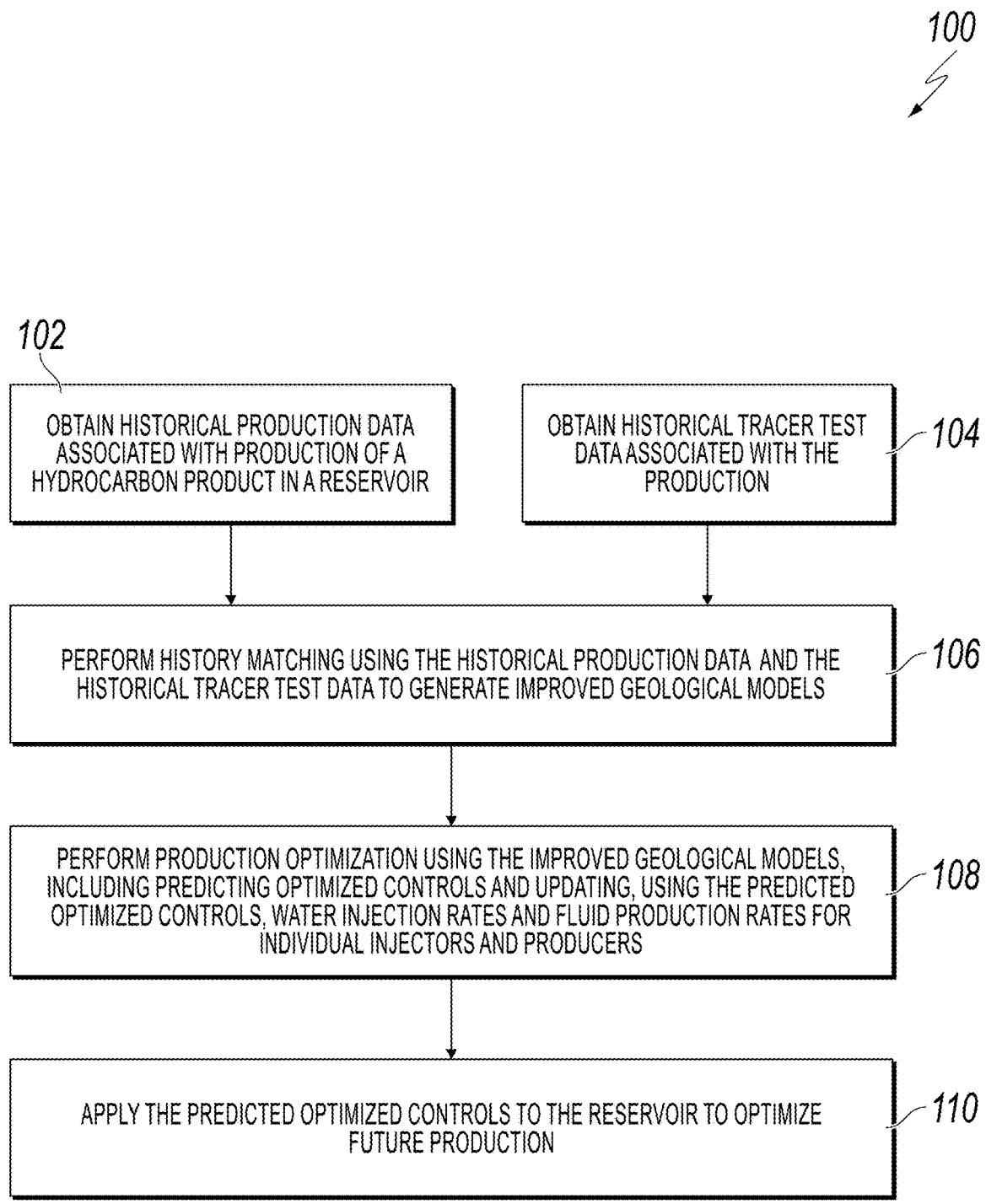
FIG. 1 is a flowchart illustrating an example of a method for enhancing the subsurface hydrocarbon reservoir production optimization by integrating inter-well tracer test data, according to an implementation of the present disclosure.

The following detailed description describes various techniques for enhancing reservoir production optimization through integrating inter-well tracers, and is presented to enable any person skilled in the art to make and use the disclosed subject matter in the context of one or more particular implementations. Various modifications, alterations, and permutations of the disclosed implementations can be made and will be readily apparent to those or ordinary skill in the art, and the general principles defined can be applied to other implementations and applications, without departing from the scope of the present disclosure. In some instances, details unnecessary to obtain an understanding of the described subject matter can be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

This disclosure describes implementations that include the use of continuous tracer arrivals (or non-arrivals) and quantitative or semi-quantitative proportional allocations for long periods of time (rather than brief studies). These and other implementations can improve the quality of reservoir modeling history-matching and can provide a richer list of attributes to constrain matches than presently-used technologies. Some implementations can include the use of inter-well tracers that can be continuously injected at low unit material cost. The inter-well tracers can be continuously monitored and detected in real time with highly-sensitive, automated, and networked detection units distributed among producer wells. The inter-well tracers can be features of oilfield production parameters monitoring programs, such as to monitor pressure, flow rates, and water-cut conditions. Planning and strategy for the use of tracer injections can take into account other potentially available quantities, such as bottom hole pressures. The relative costs of these different monitoring elements can be included in the analysis to provide maximum overall information at minimum total equipment and service cost, which can optimize water injection rates in injector wells and well zones for increased oil recovery.

Various types of tracer tests have been used in many production fields before. However, many of the tracer tests have only been used qualitatively without utilizing the full potential of data that is provided by the techniques described in this disclosure. For example, the techniques can include the development and use of advanced tracer systems, including materials and detection schemes. This disclosure also provides an "answering product" which can harness the full potential of the tracer systems. Including tracer data can dramatically increase the constraints on the history match process compared to traditional history match process that do not include tracer data. Using tracers to understand well connectives can be a more cost-effective and nonintrusive method compared to commercially available alternatives, such as pressure interference studies, loggings, additional well drillings, and tomography.

Some implementations can rely on workflow for enhancing reservoir production optimization by integrating inter-well tracer test data. Algorithms, such as an ensemble smoother with multiple data assimilation with tracer data (ES-MDA-Tracer), can be used. The algorithms can improve the ability to do history matching using the integrated production and tracer test data to generate accurate reservoir geological models with better prediction accuracy. The reservoir geological models can then be used in production optimization.

FIG. 1 is a flowchart illustrating an example of a method 100 for enhancing the subsurface hydrocarbon reservoir production optimization by integrating inter-well tracer test data, according to an implementation of the present disclosure. For clarity of presentation, the description that follows generally describes method 100 in the context of the other figures in this description. However, it will be understood that method 100 can be performed, for example, by any suitable system, environment, software, and hardware, or a combination of systems, environments, software, and hardware, as appropriate. In some implementations, various steps of method 100 can be run in parallel, in combination, in loops, or in any order.

At 102, historical production data associated with production of a hydrocarbon product (such as gas or oil) in a reservoir is obtained. For example, historical production data can be obtained from a reservoir. For example, the historical production data can include one or more of an oil or gas production rate, a water production rate, a bottom hole pressure, a wellhead pressure, a water injection rate, a gas injection rate, and an injection pressure. The production data can apply to individual wells or to combinations of groups of wells, such as measured from a gas-oil separation plant (GOSP) as a function of historical production time.

The historical production data can be obtained from a company's centralized data bases or regional field-level data servers. The data format can be, for example, plain text files or spreadsheets. In some implementations, in order to perform steps that follow step 102, the historical production data can be converted to plain text files or some other standard format. From 102, method 100 proceeds to 104.

At 104, historical tracer test data associated with the production is obtained. The tracer test data can be obtained from inter-well tracer tests, including using or based on chemicals that are injected in the injection wells or produced from producing wells. Historical tracer test data can be obtained from tracer test data that was collected previously, or other tracer tests can be performed to collect other data. In some implementations, tracer test data can be described using tracer breakthrough curves, which can plot produced tracer concentrations as a function of production time from individual wells or combinations of groups of wells. The injected chemicals can be ions, small molecules, macromolecules, and nanomaterials.

The historical tracer data and other tracer test data may be obtained from a company's centralized data bases or regional field-level data servers. The data format can be plain text files, spreadsheets, or other data storage media. In some implementations, in order to perform steps that follow step 104, the historical production data can be converted to plain text files or some other standard format. From 104, method 100 proceeds to 106.

At 106, history matching is performed using the historical production data and the historical tracer test data to generate improved geological models. History matching can include adjusting reservoir models until the models closely reproduce the past behavior of a reservoir. The reservoir models can usually include or use reservoir porosity distributions, permeability distributions, fracture distributions, oil/gas/water physical properties, and interactions with aquafers. This disclosure includes a description and utilization of an algorithm, the ensemble smoother with multiple data assimilation with tracers (ES-MDA-Tracer).

The ES-MDA-Tracer algorithm is performed using workstation computers with applications developed in-house and a reservoir simulator package. The applications can read historical production and tracer test data in the format of plain text files that can be output from steps 102 and 104. The applications can perform the algorithm and output geology models in the format of plain text files that can then be saved. From 106, method 100 proceeds to 108.

At 108, production optimization is performed using the improved geological models, including predicting optimized controls and updating, using the predicted optimized controls, water injection rates and fluid production rates for individual injectors and producers. For example, production optimization can be performed using the improved geological models to predict the optimized controls. Production optimization can include, for example, the process of adjusting production control parameters to achieve production objectives, such as the highest total oil recovery, the highest net present value (NPV), and the lowest water injection. The production control parameters can be adjusted and the production objectives can be achieved while during production. The control parameters can include water injection rates, fluid production rates, and addition of new wells (infill drilling), among other possible control parameters. Production optimization can rely on existing geological models. Performing production optimization can use any optimization algorithms (or optimizers) on geological models that are history-matched with the combination of production data and tracer test data (such as, from step 106). Suitable optimizers can include, for example, an ensemble-based optimization (EnOpt) algorithm which can be integrated with the ES-MDA-Tracer algorithm.

The production optimization algorithm can be performed using applications that execute workstation computers. The applications can be developed in-house, or reservoir simulator packages can be used. The applications can read geology models in the format of plain text files outputted, such as output from step 106. The applications can perform the algorithm and output optimized control parameters in the format of plain text files. From 108, method 100 proceeds to 110.

At 110, the predicted optimized controls are applied to the hydrocarbon reservoir to optimize future production. For example, the optimized controls can be applied back to the reservoir for the optimized future production. For example, optimized controls can be based on the optimized control parameters generated at steps 106 and 108. The optimized control parameters, which can include, for example, dynamic water injection rates and fluid production rates for individual injectors and producers, can then be applied to the real field for future production.

Real field operations can rely on reservoir management systems that usually include integrated facilities from central servers at corporate headquarters, to regional field-level servers, down to individual flow control valves at wellheads. The algorithms described in this disclosure can be built into the central servers or regional servers. The outputs from step 108, including the optimized control parameters in the format of plain text files, can be used directly by the reservoir management systems to control the individual flow valves for real productions. The specific file formats for reservoir management systems can depend on the specific designs for those systems. After 110, method 100 stops. In some implementations, steps of method 100 can be performed repetitively during the life of a reservoir.

An example implementation of the ES-MDA-Tracer algorithm previously described with reference to step 106 of FIG. 1 is summarized here. The analyzed vector of model parameters $m^a$ can be written as:

$$m_j^a = m_j^f + C_{MD}^f (C_{DD}^f + \alpha_i C_D)^{-1} (d_{uc,j} - d_j^f), \quad (1)$$

for $j=1,2,\ldots,N_e$, with $N_e$ denoting the number of ensemble members. The term $C_{MD}^f$ is the cross-covariance matrix between the prior vector of model parameters, $m^f$, and the vector of predicted data, $d^f$. The term $C_{DD}^f$ is the $N_d \times N_d$ auto-covariance matrix of predicted data, with $N_d$ denoting the total number of measurements assimilated. $d_{uc} \sim N(d_{obs}, C_D)$ is the vector of perturbed observations, with $d_{obs}$ denoting the observed real data from field and $C_D$ denoting a user defined $N_d \times N_d$ auto-covariance matrix of observed data measurement errors. Terms $\alpha_i$, $i=1,2,\ldots,N_a$ are predefined inflation coefficients that satisfy $$\sum_{i=1}^{N_a} \frac{1}{\alpha_i} = 1,$$

with $N_a$ denoting the number of data assimilation iterations.

In terms of an oil production rate (opr), a water production rate (wpr), and tracer concentrations ($c_k$, $k=1,2,\ldots,N_t$, with $N_t$ denoting total number of distinguishable tracers), the $N_d$-dimensional data vector can be written as:

$$d=[\text{opr}^1, \text{wpr}^1, c_1^1, c_2^1, \ldots, c_{N_t}^1, \text{opr}^2, \text{wpr}^2, c_1^2, c_2^2, \ldots, c_{N_t}^2, \ldots, \text{opr}^{N_s}, \text{wpr}^{N_s} c_1^{N_s}, c_2^{N_s}, \ldots, c_{N_t}^{N_s}]^T, \quad (2)$$

with $N_S$ denoting the total number of history data assimilation time-steps.

To implement the algorithm, a reservoir simulator with the capability of simulating tracers can be used. $N_a$ iterations of reservoir simulations and data assimilations (Equation (1)) can be performed to refine the history matched reservoir models.

Figure 2:
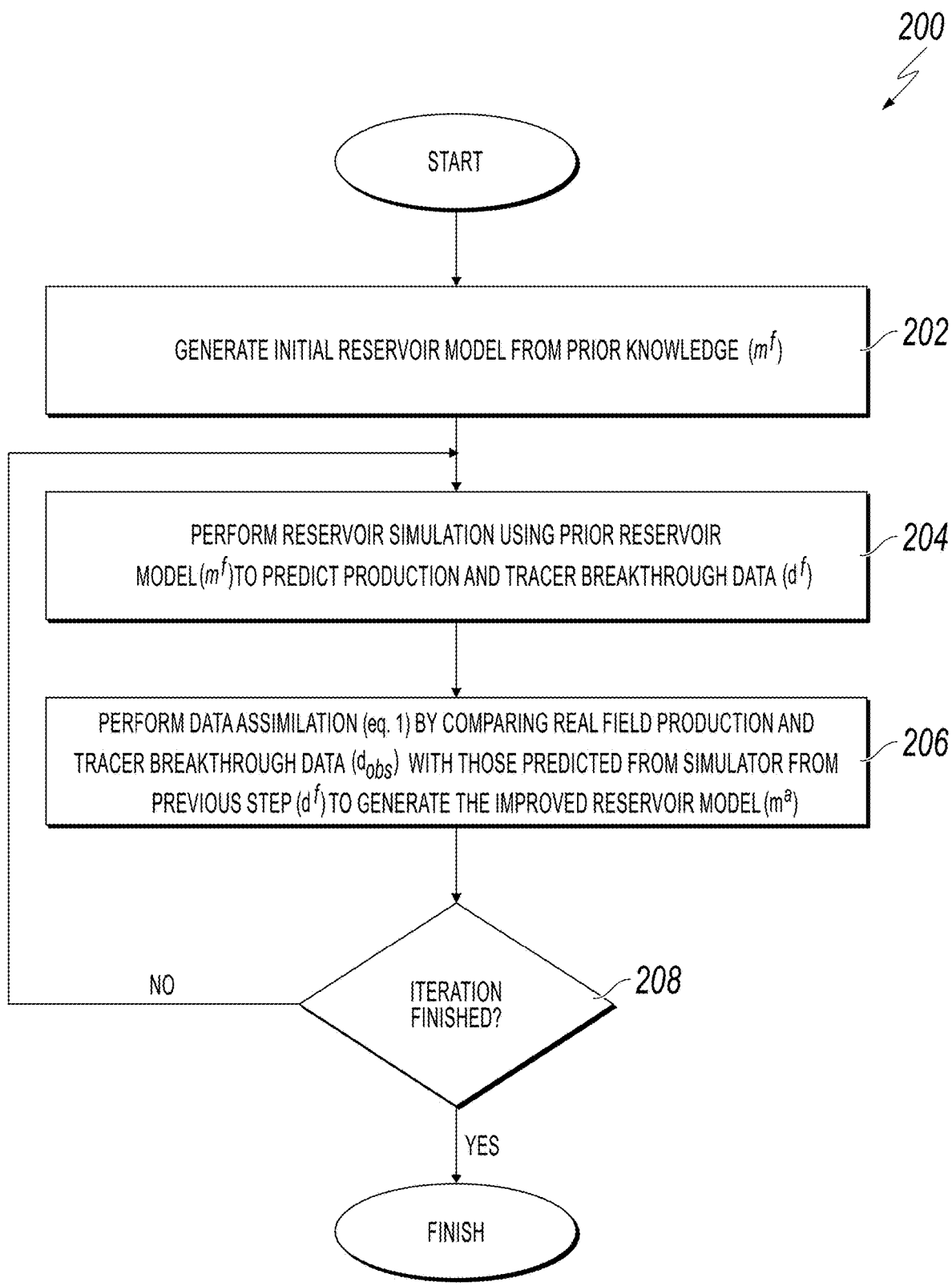
FIG. 2 is a flowchart illustrating an example of a method for updating reservoir models, according to an implementation of the present disclosure.

FIG. 2 is a flowchart illustrating an example of a method 200 for updating reservoir models, according to an implementation of the present disclosure. For clarity of presentation, the description that follows generally describes method 200 in the context of the other figures in this description. However, it will be understood that method 200 can be performed, for example, by any suitable system, environment, software, and hardware, or a combination of systems, environments, software, and hardware, as appropriate. In some implementations, various steps of method 200 can be run in parallel, in combination, in loops, or in any order.

At 202, initial reservoir models are generated using generic geological software, designed by ad hoc guessing, or taken from existing models. The models can be transferred into the format of plain text files. From 202, method 200 proceeds to 204.

At 204, reservoir simulations are performed using reservoir simulators. For example, the reservoir models from the previous step can be transferred to the formats that are readable from specific reservoir simulators. The predicted production and tracer breakthrough data can be placed in a format needed by the simulators, such as in plain text files. From 204, method 200 proceeds to 206.

At 206, data assimilations are calculated, such as using in-house written applications, to read historical production data and tracer breakthrough data in the format of plain text files, perform calculations, and output updated reservoir models in the plain text format. From 206, method 200 proceeds to 208.

At 208, a determination is made whether iteration is finished. If iteration is not finished, then method 200 proceeds to 204. If iteration is finished, then after 208, method 200 stops.

In some implementations, the EnOpt algorithm, which is now described in more detail, can be used to implement step 108 of FIG. 1. The complete control parameters can be written in an $[(N_i+N_p)*N]$-dimensional vector:

$$u=[w_{i,1}^1, \ldots, w_{i,N_i}^1, w_{p,1}^1, \ldots, w_{p,N_p}^1, \ldots, w_{i,1}^N, \ldots, w_{i,N_i}^N, w_{p,1}^N, \ldots, w_{p,N_p}^N]^T, \quad (3)$$

where $w_{i,n_i}^n$ and $w_{p,n_p}^n$ are the water injection rate and fluid production rate, respectively, for the $n_i^{th}$ injector and $n_p^{th}$ producer at time step n, $N_i$ is the number of injectors, $N_p$ is the number of producers, and N is the total number of optimization steps. A goal of the optimization algorithm can be to maximize an objective function J(u), such as in:

$$J(u) = NPV = \frac{\sum_{n=1}^{N}\left[\sum_{i=1}^{N_p}(r_o q_{o,i}^n - r_w q_{w,i}^n)\right]\Delta t^n}{(1+b)^{t^n/365}}, \quad (4)$$

where $r_o$ is the oil price, $r_w$ is the water disposal cost, b is the discount rate, $q_o$ is the oil production rate, $q_w$ is the water production rate, $\Delta t^n$ is the step size of each time step, and $t^n$ is the elapsed production time. The steepest ascent algorithm can be used to update control parameters:

$$u_{k+1} = u_k + \alpha_k \frac{C_U d_k}{\|C_U d_k\|_\infty}, \quad (5)$$

where k is the iteration indices, $\alpha_k$ is a step size of the steepest ascent algorithm, $C_U$ is a covariance matrix for the control parameters, and $d_k$ is the approximate gradient which can be calculated from:

$$d_k = \frac{1}{N_e}\sum_{j=1}^{N_e}(\hat{u}^j - u^k)(J(\hat{u}^j) - J(u^k)), \quad (6)$$

where $N_e$ is the ensemble size, and $\hat{u}^j$ is the set of perturbed control parameters that can be given by:

$$\hat{u}^j = u^k + C_U^{1/2} Z^j, \quad (7)$$

where the components of $Z^j$ are independent standard random normal deviates. For optimization objectives with constraints, different transformation functions (such as, log-transforms) may be applied on the control parameters (such as, in Equation (3)) before using steepest ascent algorithms.

Figure 3:
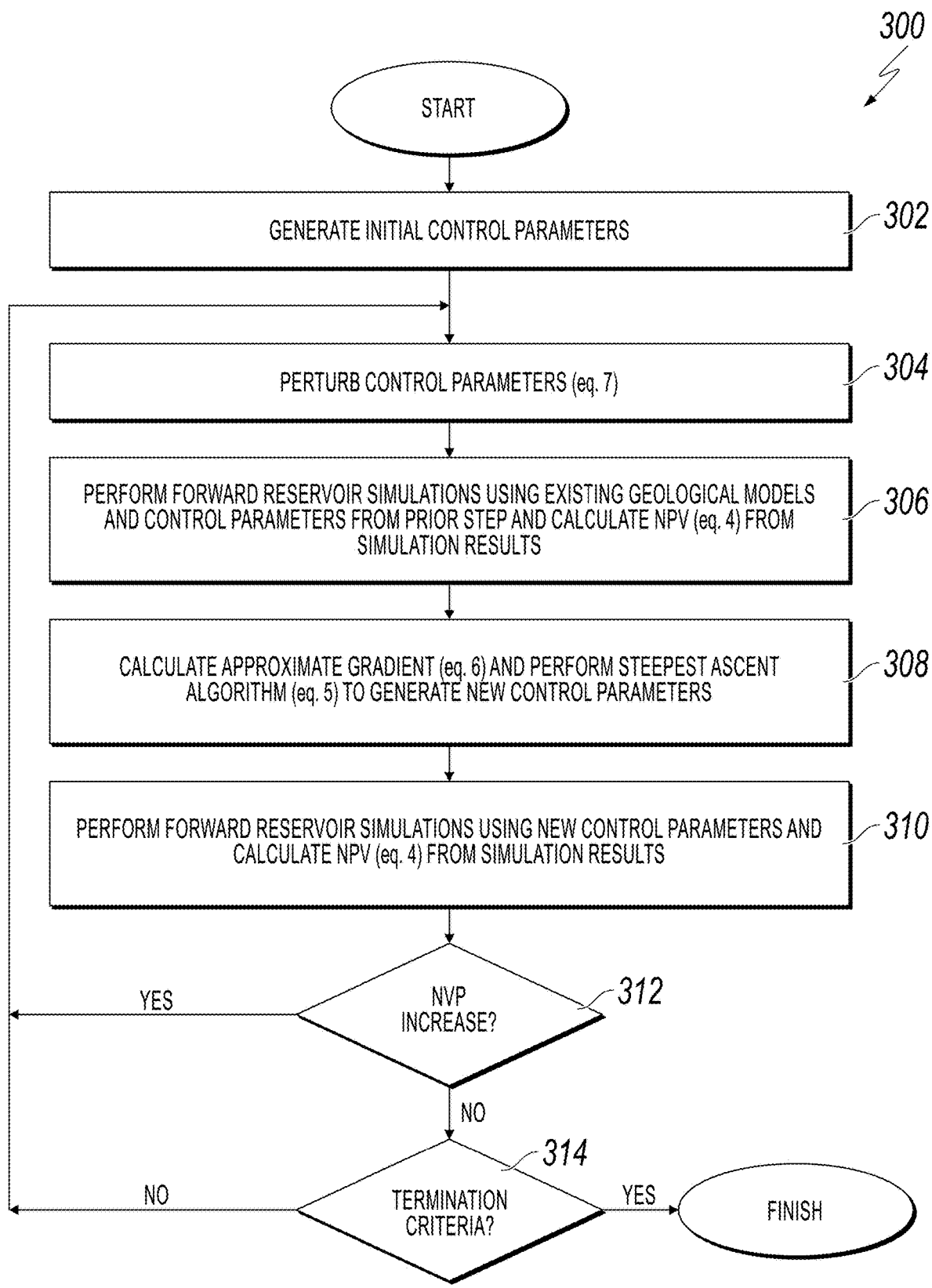
FIG. 3 is a flowchart illustrating an example of a method for implementing the ensemble-based optimization (EnOpt) algorithm, according to an implementation of the present disclosure.

FIG. 3 is a flowchart illustrating an example of a method 300 for implementing the ensemble-based optimization (EnOpt) algorithm, according to an implementation of the present disclosure. For clarity of presentation, the description that follows generally describes method 300 in the context of the other figures in this description. However, it will be understood that method 300 can be performed, for example, by any suitable system, environment, software, and hardware, or a combination of systems, environments, software, and hardware, as appropriate. In some implementations, various steps of method 300 can be run in parallel, in combination, in loops, or in any order.

At 302, initial control parameters can be generated using ad hoc guessing, and the initial control parameters can be saved in the format of plain text. From 302, method 300 proceeds to 304.

At 304, the set of perturbed control parameters are determined. For example, the set of perturbed control parameters can be determined using Equation (7). From 304, method 300 proceeds to 306.

At 306, reservoir simulations are performed using reservoir simulators. The perturbed control parameters from the previous step can be transformed into formats that are readable by specific reservoir simulators. After the reservoir simulations are performed, the predicted NPV can be calculated, such as using Equation (4), using outputs from specific simulators as input. The predicted NPV can be saved as text formats as output. From 306, method 300 proceeds to 308.

At 308, improved new control parameters are determined. For example, the new control parameters can be determined using calculations based on Equations (5) and (6), and the improved new control parameters can be output in plain text format. From 308, method 300 proceeds to 310.

At 310, reservoir simulations are performed using reservoir simulators. The improved new control parameters from the previous step can be transformed into formats that are readable from specific reservoir simulators. After the reservoir simulations are performed, the predicted NPV can be calculated, such as using Equation (4), using outputs from specific simulators as input. The predicted NPV can be saved as text formats as output. From 310, method 300 proceeds to 312.

At 312, a determination is made whether the termination criteria are met, such as if NPV is not increasing for certain numbers of re-perturbation of control parameters. Other termination criteria may also be applied, such as $|J(u_{k+1})-J(u_k)|/|J(u_k)|<c_1$, or $\|u_{k+1}-u_k\|/\max(\|u_k\|, 1.0)<c_2$, where $c_1$ and $c_2$ are small numbers. From 312, method 300 proceeds to 314.

At 314, a determination is made whether termination criteria exists. If termination criteria does not exist, then method 300 proceeds to 304. If termination criteria exists, then after 314, method 300 stops.

Experimentation was performed to verify the disclosed methods and algorithms. FIGS. 4-10, for example, provide details of the experimentation. The results of the experimentation reinforce the fact that including tracer test data in history matching can increase the prediction accuracy of reservoir models. Improved reservoir models can then be used by reservoir production optimizers to generate better control parameters which result in better production and greater net present values. In some implementations, experimental reservoir simulations can be performed using the University of Texas Chemical Compositional Simulator (UTCHEM), which is capable of simulating tracers.

Figure 4:
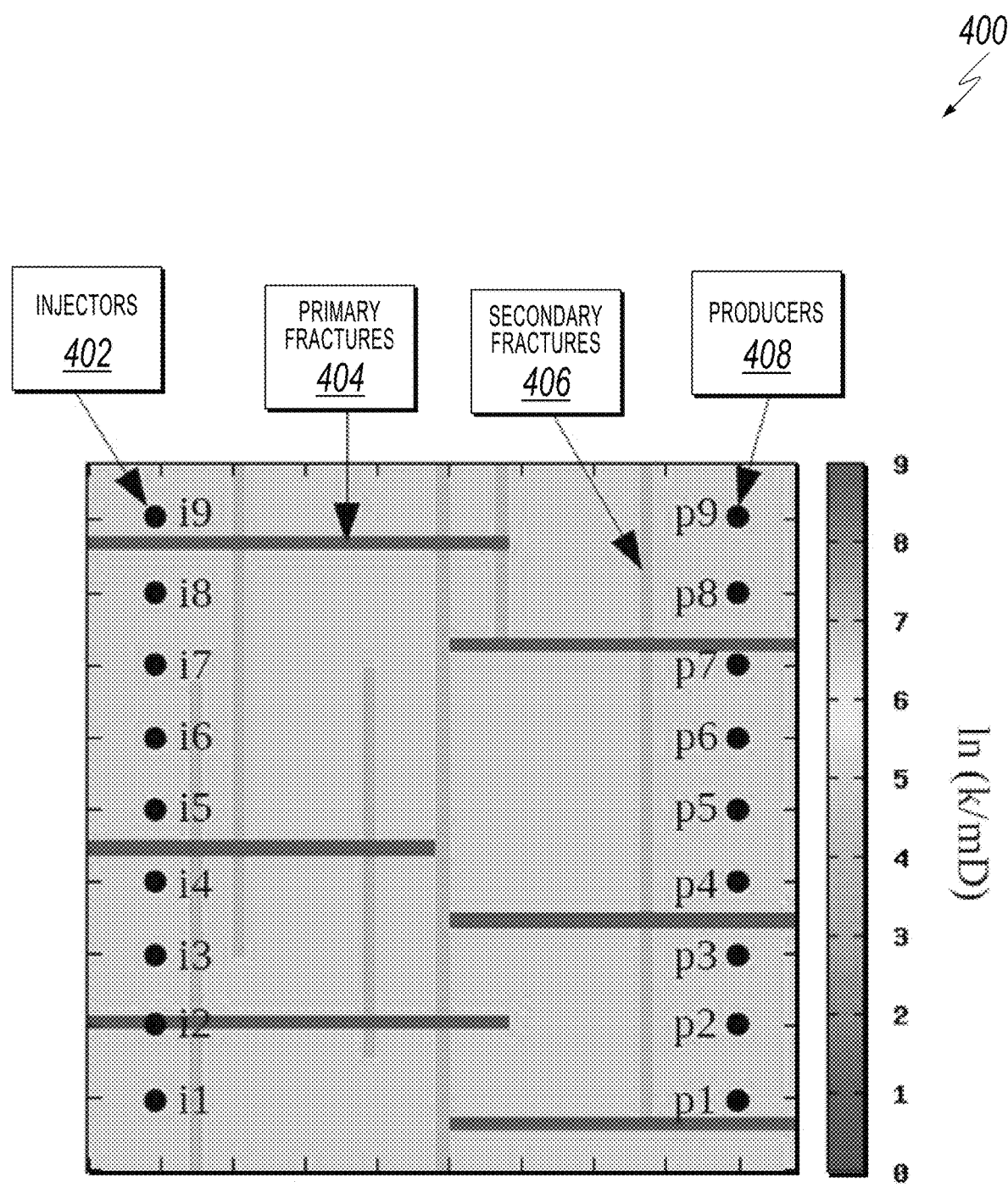
FIG. 4 illustrates an example of a synthetic fractured reservoir model, according to an implementation of the present disclosure.

FIG. 4 illustrates an example of a synthetic fractured reservoir model 400, according to an implementation of the present disclosure. The fractured reservoir model 400 includes injectors 402, primary fractures 404, secondary fractures 406, and producers 408. As shown in FIG. 4, shading on the primary fractures 404 and the secondary fractures 406, for example, is according to a gradient scale 410, with greater numbers on the gradient scale 410 corresponding to more primary fractures. The model can serve as the virtual "real" reservoir in the following numerical example in which experimentation was performed, including using tracer tests, history matching, and production optimization. The model shown is made by a 50×50×1 grid block system with constant individual block size of 60 ft×60 ft×20 ft. The total field size is 3000 ft×3000 ft×20 ft. The porosity and initial water saturation are set to 0.2 and 0.1 respectively. There are 9 injectors and 9 producers on this field with a line drive pattern. The rock-fluid properties (interfacial tension, viscosity, densities, etc.) are assumed to be known.

Constant injection and production rates q=100 ft³/day were used during experimentation for all injectors and producers for the first 10,000 days of reservoir simulation. These production data were assumed to be known and were considered as the targets for history matching. These rates correspond, for example, to steps 102 and 104 of method 100. In this example, one tracer test was performed at t=5,000 (or the 5000$^{th}$ day).

Figure 5A:
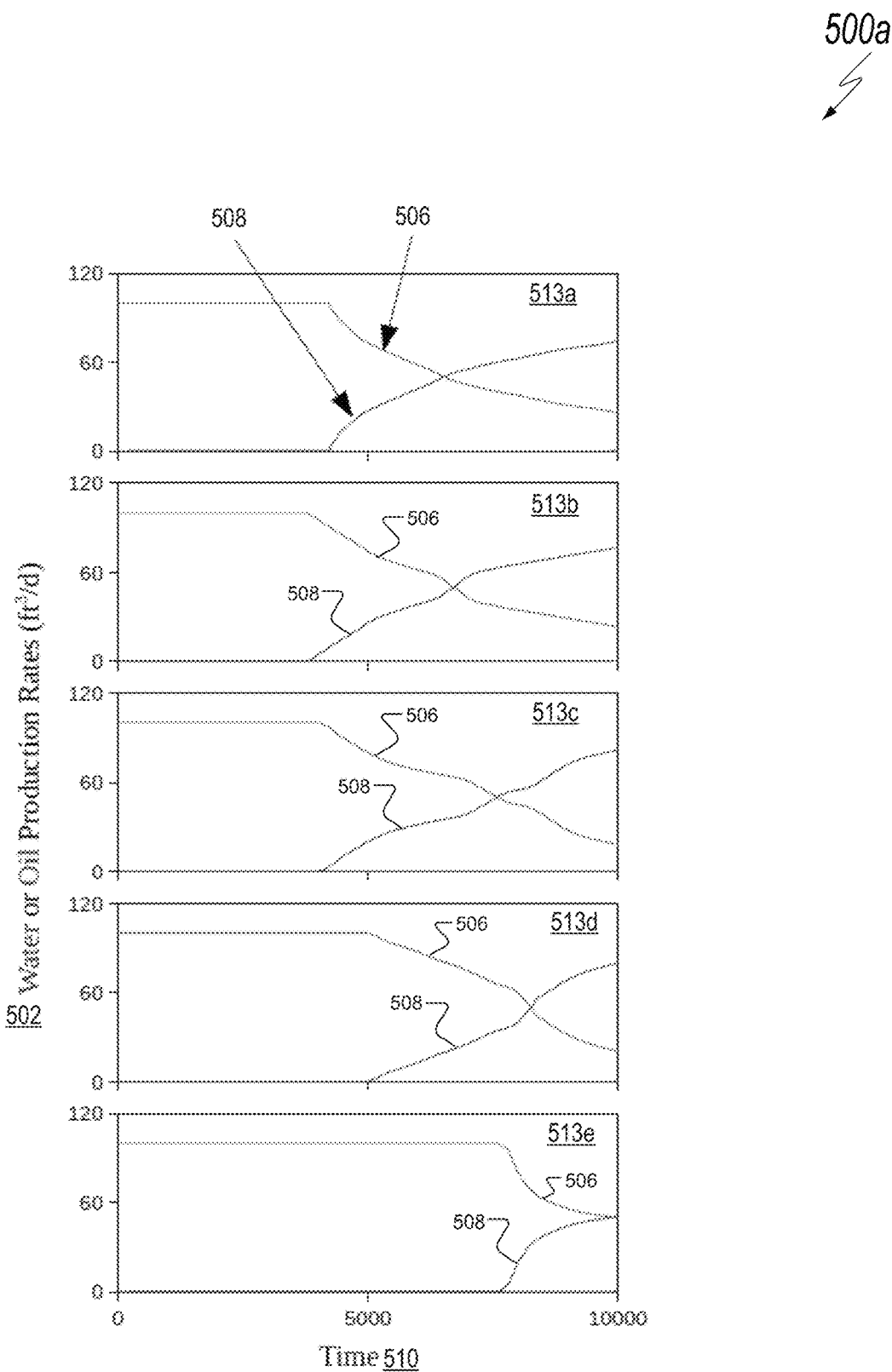
FIGS. 5A and 5B depict graphs illustrating examples of historical production data and tracer breakthrough data for selected producers, according to an implementation of the present disclosure.
Figure 5B:
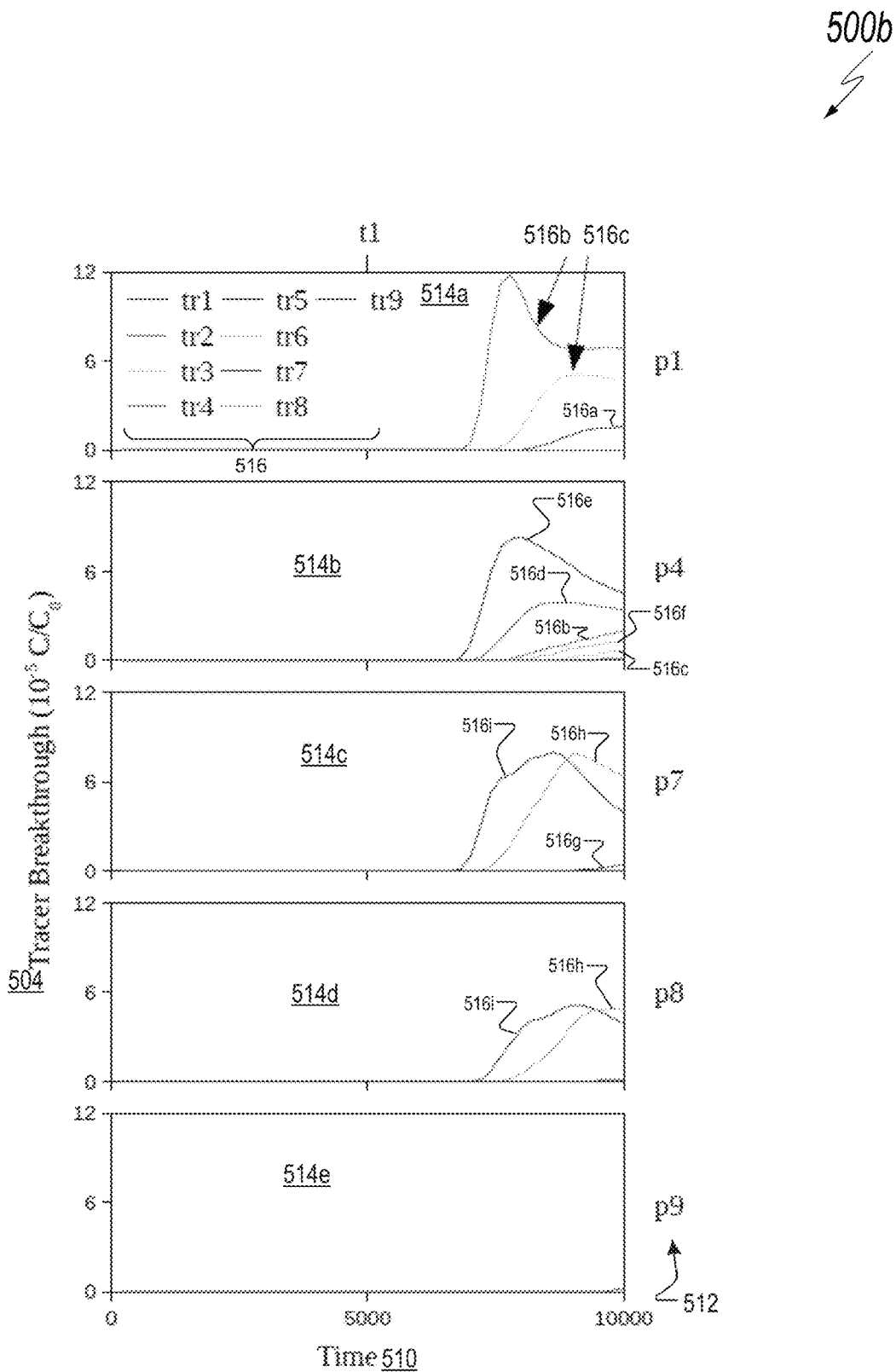

FIGS. 5A and 5B depict graphs 500a and 500b illustrating examples of historical production data 502 and tracer breakthrough data 504 for selected producers, according to an implementation of the present disclosure. As shown in graphs 513a-513e, for the production data 502, oil production rate (opr) 506 gradually decreased while water production rate (wpr) 508 gradually increased with increasing time 510. Note that the production data in graphs 513a-513c from producers 512 p1, p4, and p7 are similar, which can create challenges for history matching for unique geological models. Tracer test data is shown in graphs 514a-514e, which tracer breakthrough can be observed from producers 512 p1, p4, p7 and p8 in graphs 514a-514d. FIG. 5B depicts tracer breakthroughs 516 that include tracer breakthroughs 516a-516i for tracers tr1 through tr9, respectively. Note that the observed tracers from p1, p4, p7, and p8 were mainly from injector 2 (tr2 tracer breakthrough 516b), injector 5 (tr5 tracer breakthrough 516e), injector 8 (tr8 tracer breakthrough 516h), and injector 9 (tr9 tracer breakthrough 516i), which are consistent with the fracture pattern of the model reservoir (See FIG. 4).

After the historical production data and tracer breakthrough data have been collected from the virtual "real" reservoir, reservoir history matching can be performed using the ensemble smoother with multiple data assimilation with or without tracer data (ES-MDA or ES-MDA-Tracer) algorithms. This matching corresponds, for example, with step 106 of method 100. Specifically, in experimentation, for ES-MDA (without tracer data), only production data 502 was used, while for ES-MDA-Tracer (with tracer data), both production data 502 and tracer breakthrough data 504 were used.

For the history matching algorithms, such as corresponding to FIG. 2, $N_e$=100 ensemble members were used with $N_a$=20 iterations. Nine independent sets of initial ensemble members were generated from geo-statistical software with optimized variograms.

Figure 6A:
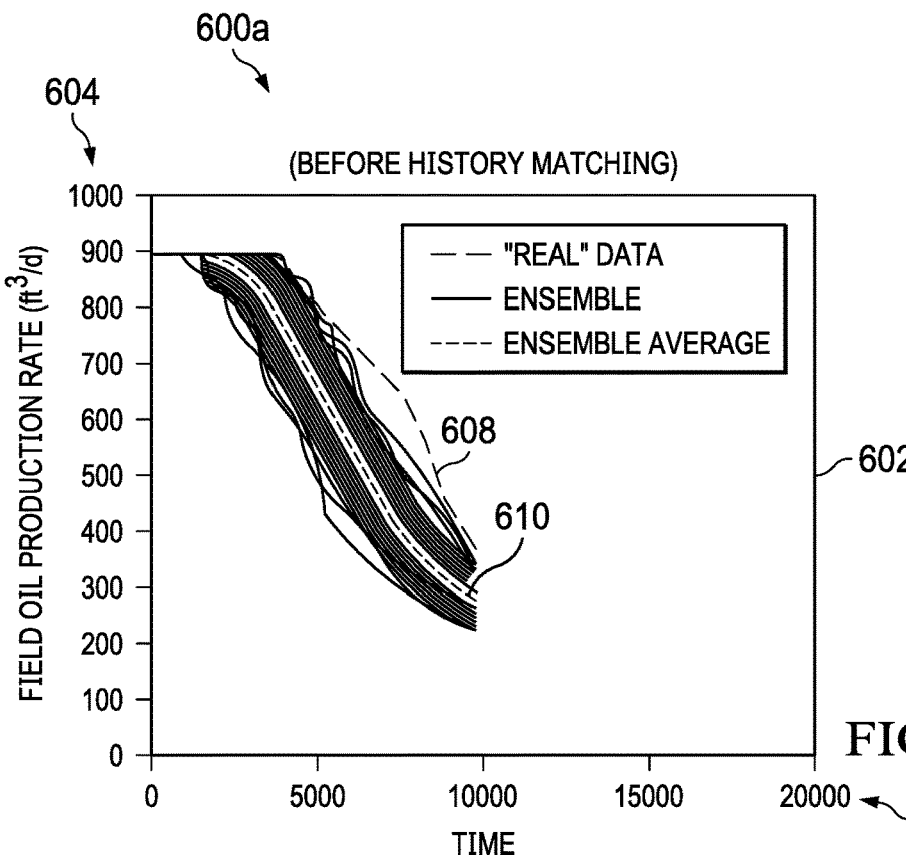
FIGS. 6A-6C show example field production rates over time.
Figure 6B:
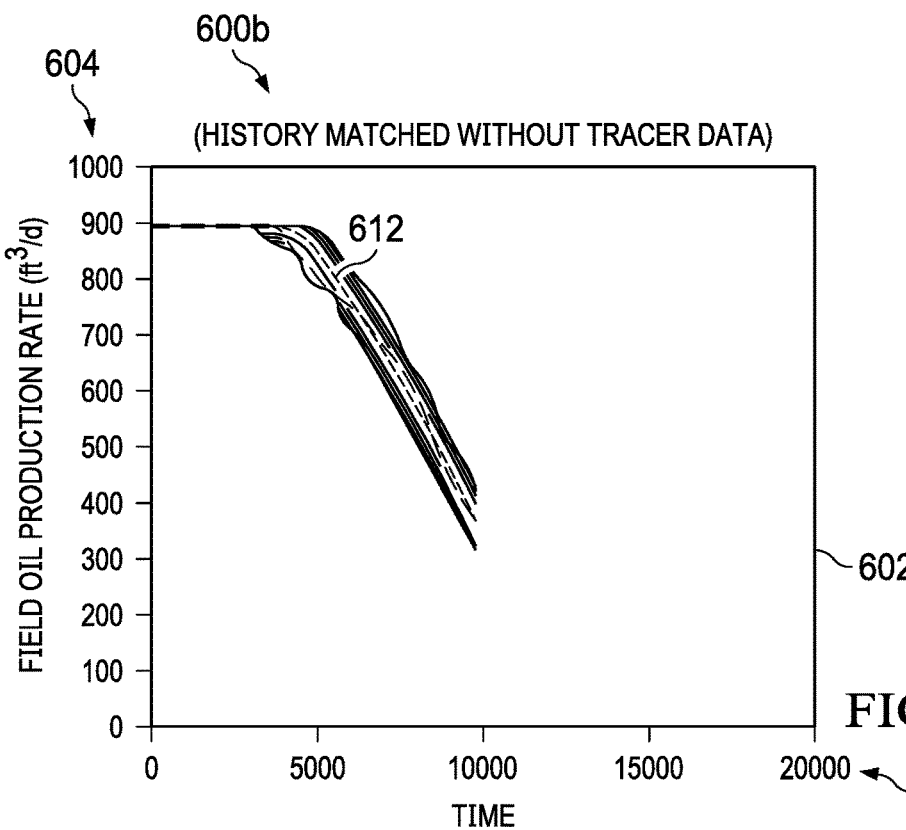
Figure 6C:
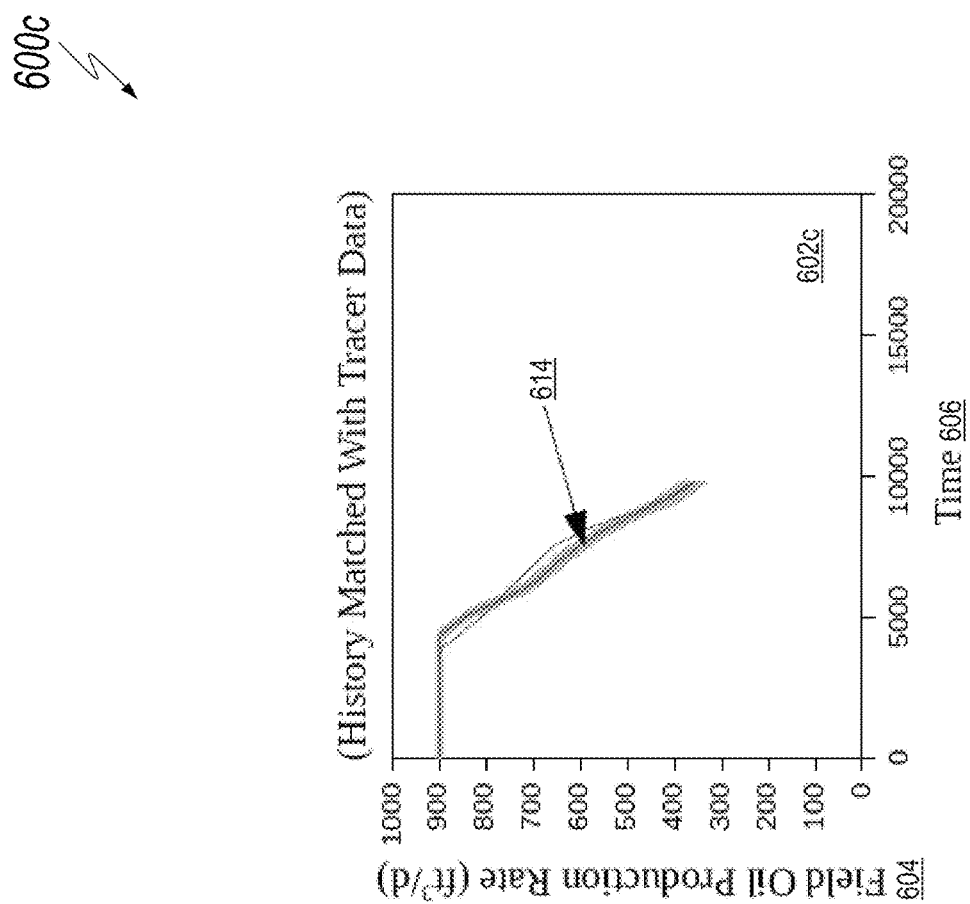

FIGS. 6A-6C show example field production rates 604 over time 606. Graph 602a depicts production rates before history matching, according to an implementation of the present disclosure. Graphs 602b and 602c depict production rates 604 after history matching, with the history matching in graph 602b done without tracer data, and the history matching in graph 602c done with tracer data. As shown in graphs 602b and 602c, good history matchings for production data can be achieved with or without the inclusion of tracer data. While this result implies that tracers do not improve the history matching, as will be shown later, the reservoir models history matched with tracer data can result in better prediction accuracy, resulting in better production optimization. FIG. 6A depicts oil production rates 608 from real field data and predicted oil production rates 610 from geological models before history matching. FIG. 6B depicts predicted oil production rates 612 from geological models history matched without tracer data. FIG. 6C depicts predicted oil production rates 614 from geological models history matched with tracer data.

Figures 7A, 7B:
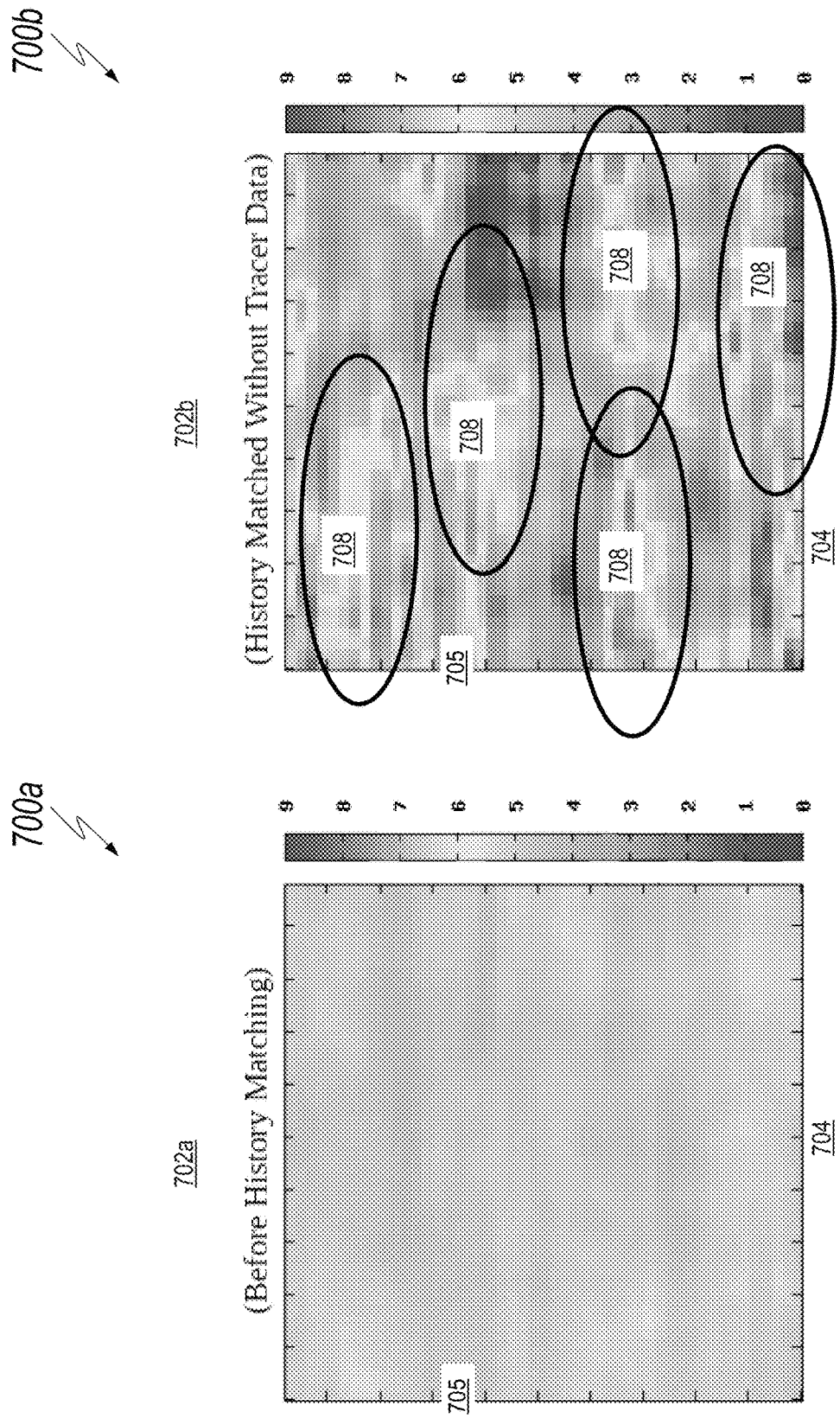
FIGS. 7A-7C depict data plots illustrating example geological models, according to an implementation of the present disclosure.
Figure 7C:
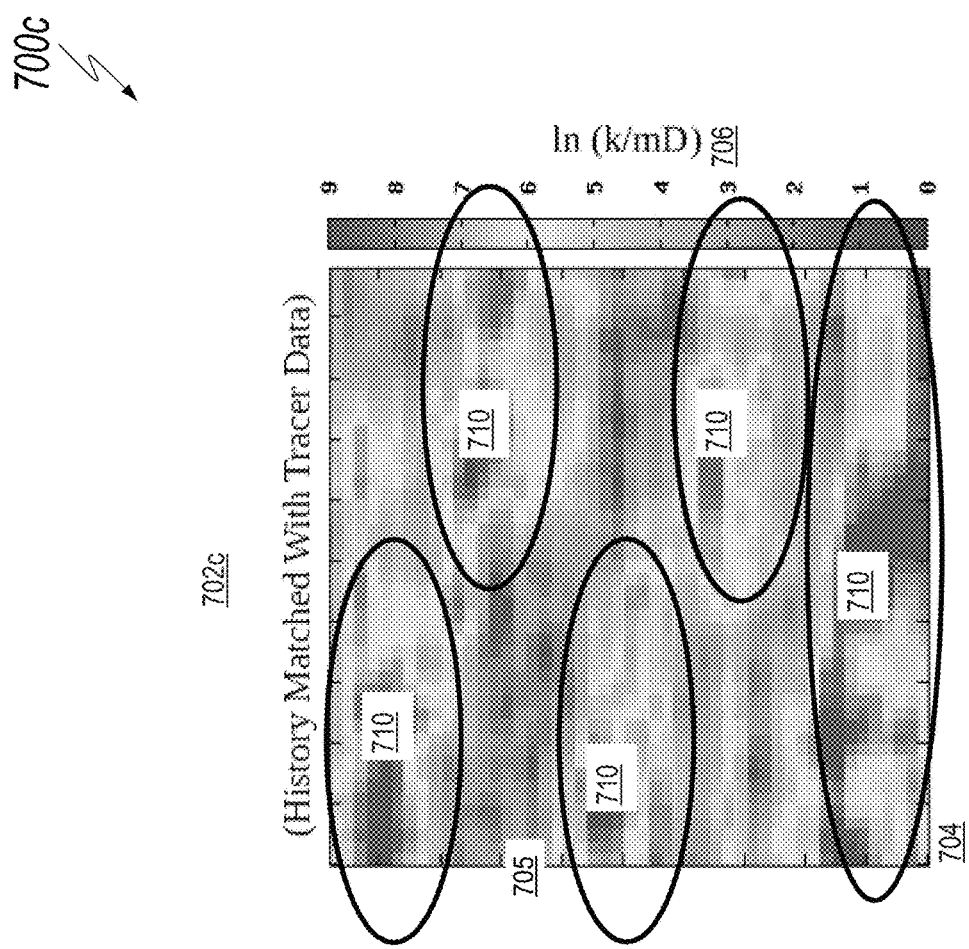

FIGS. 7A-7C depict data plots illustrating example geological models 702a-702c, according to an implementation of the present disclosure. For example, the geological model 702a corresponds to permeability map before history matching. Geological models 702c and 702b correspond to permeability maps after history matching, with or without tracers, respectively. These geological models 702a-702c correspond to matching, for example, associated with step 106 of method 100. Fracture patterns 708 are captured from geological models history matched without tracer data. Fracture patterns 710 are captured from geological models history matched with tracer data. The virtual "real" reservoir fracture patterns were shown on FIG. 4. It can be clearly seen that the geological models history matched with tracer data in the geological model 702c can capture much more accurate details of the fracture patterns. However, both history matched geological models with or without tracers (geological models 702b and 702c) were capable to reproduce the reservoir historical production data (shown in graphs 602b and 602c). Because detailed reservoir fracture patterns are usually unknown in real situations, reproduction of the historical production data may not be sufficient to judge the accuracy of the geological models. Axes on the data plots include an X coordinate 704, a Y coordinate 705, and a permeability color scale 706 given by ln (k/mD).

Using the history matched models, reservoir production optimization can be applied using optimizers. Optimization can occur in a process, such as method 300 previously described with reference to FIG. 3. For example, the modified ensemble-based optimization (EnOpt) algorithm can be applied to maximize the net present value (NPV) for the future production from 10,000 to 20,000 days. The NPV function can be defined as:

$$NPV = \frac{\sum_{n=1}^{N}\left[\sum_{i=1}^{N_{prod}}(r_o q_{o,i}^n - r_w q_{w,i}^n)\right]\Delta t^n}{(1+b)^{t^n/365}}, \quad (8)$$

where $r_o$=$50 is the oil price, $r_w$=$5 is the water disposal cost, b=0.1 is the discount rate, $q_o$ is the oil production rate, $q_w$ is the water production rate, $N_{prod}$ is the total number of producers, N is the total production on steps with step size $\Delta t^n$, and $t^n$ is the production time.

Figure 8A:
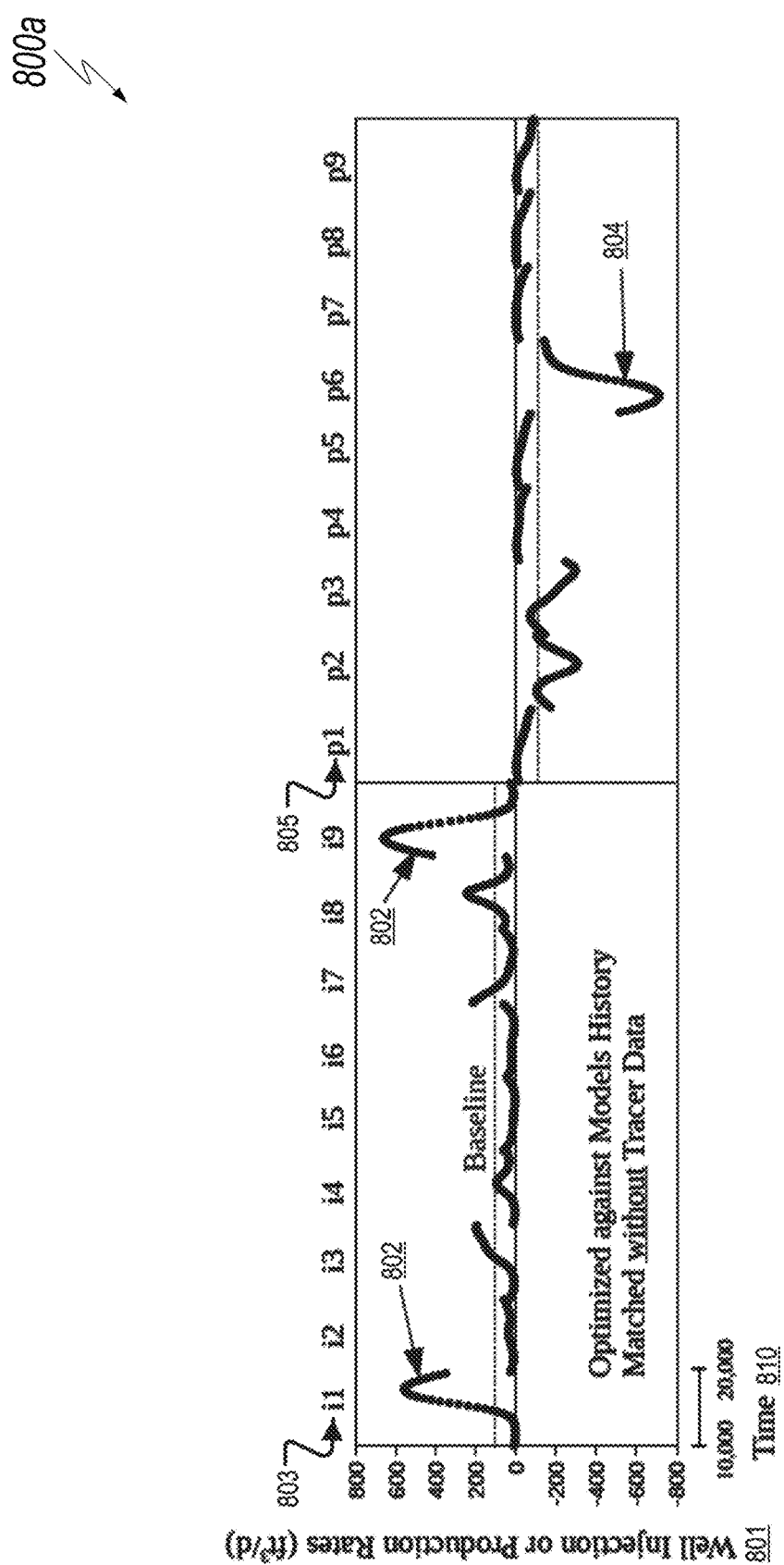
FIGS. 8A and 8B depict graphs illustrating example dynamic injection and production rates over time measured in days, according to an implementation of the present disclosure.
Figure 8B:
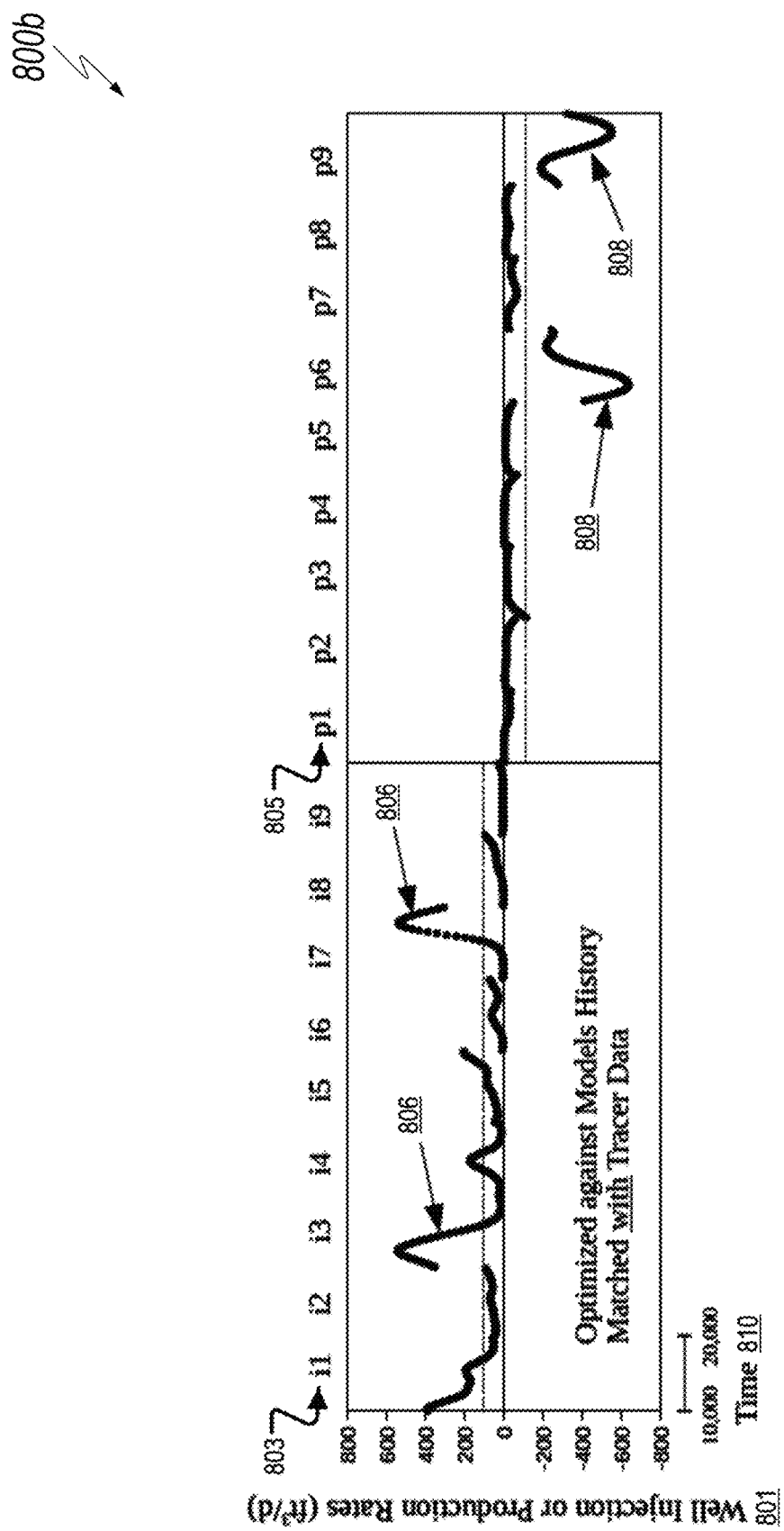

FIGS. 8A and 8B depict graphs illustrating example dynamic injection and production rates 801 over time 810 measured in days, according to an implementation of the present disclosure. For example, FIG. 8A shows representative optimized control parameters including the dynamic injection and production rates for all wells using geological models 702b. FIG. 8B shows representative optimized control parameters including the dynamic injection and production rates for all wells using geological models 702c. The optimized control parameters can be used, for example, in step 110 of method 100. In this numerical example, the optimized control parameters can be applied back to the virtual "real" field (FIG. 4), from which the quality of the optimized controls can be gauged. In real applications, the control parameters are applied to real hydrocarbon reservoir for real production. Control parameters 802 are for high injection rate injectors 803 optimized against geological models history matched without tracer data. Control parameters 804 for high production rate producers 805 optimized against geological models history matched without tracer data. Control parameters 806 are for high injection rate injectors 803 optimized against geological models history matched with tracer data. Control parameters 808 are for high production rate producers 805 optimized against geological models history matched with tracer data.

Figures 9A, 9B:
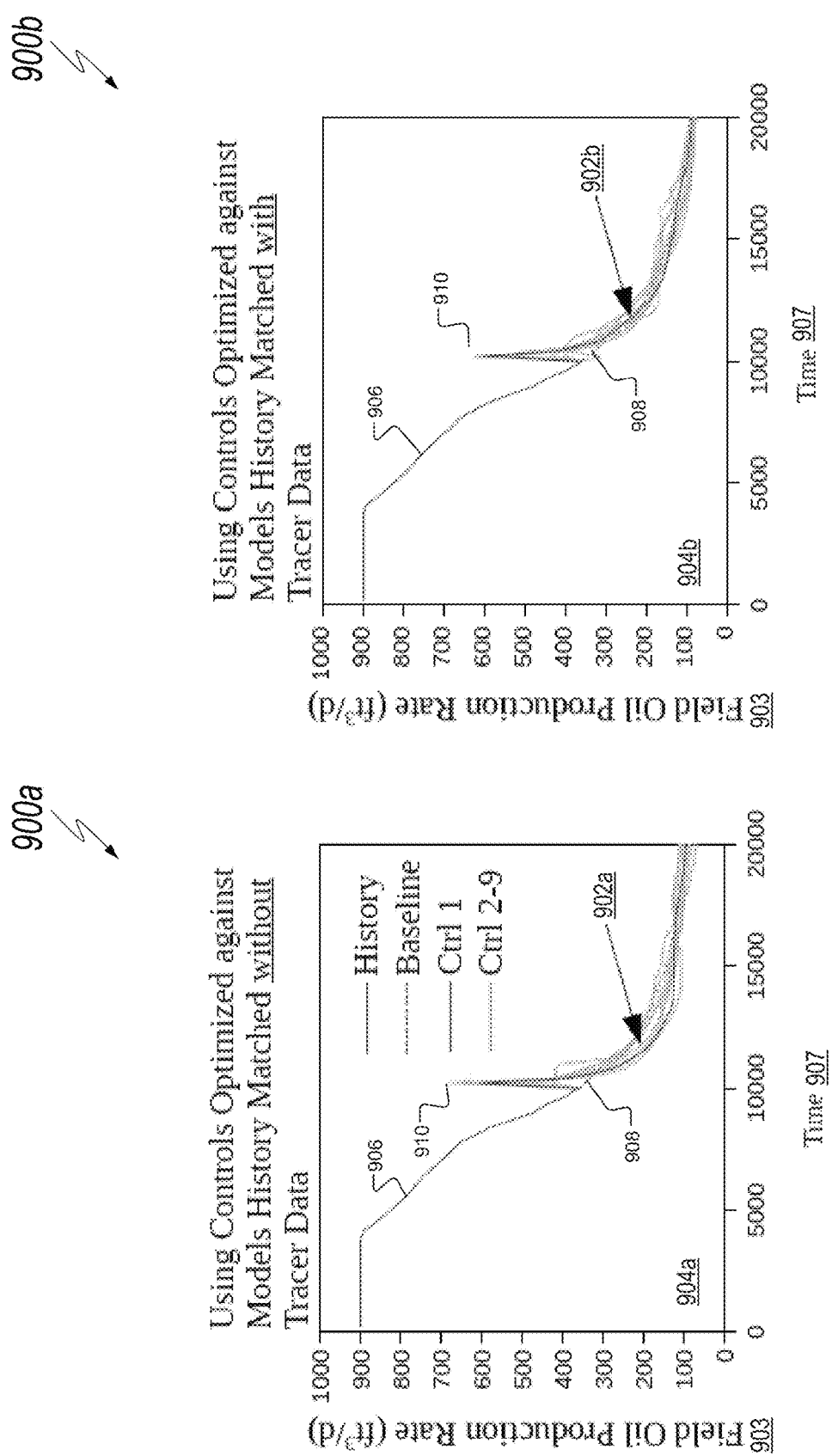
FIGS. 9A and 9B depict graphs illustrating example estimates for future oil production rates of future productions using the control parameters optimized on geological models history, according to an implementation of the present disclosure.

FIGS. 9A and 9B depict graphs illustrating example estimates for future oil production rates 902a and 902b of future productions using the control parameters optimized on geological models history, according to an implementation of the present disclosure. The estimates 902a and 902b of future productions rates 903 are shown in graphs 904b and 904a for optimization with tracer data and without tracer data, respectively. The estimates apply from t=10,000 to 20,000 days based on historical production rates 906 for times 907 before t=10,0000 days. The estimates can be the result of generating nine independent history matched geological models and nine optimized control parameters for better statistics. FIG. 9B also depicts baseline production rates 908 during which no production optimization was performed and the injectors and producers were operated at constant rates through the production time. Comparing the optimized productions with baseline, it can be observed that the optimized productions all have initial production spikes 910 around t=10,000 to 11,000. However, the productions from controls optimized from geological models history matched with tracer data (estimates 902b) show a slower decline curve comparing to the without tracer data cases (estimates 902a). The future oil production rates 902a and 902b can be based on control parameters optimized against geological models history matched without and with tracer data, respectively.

Figure 10:
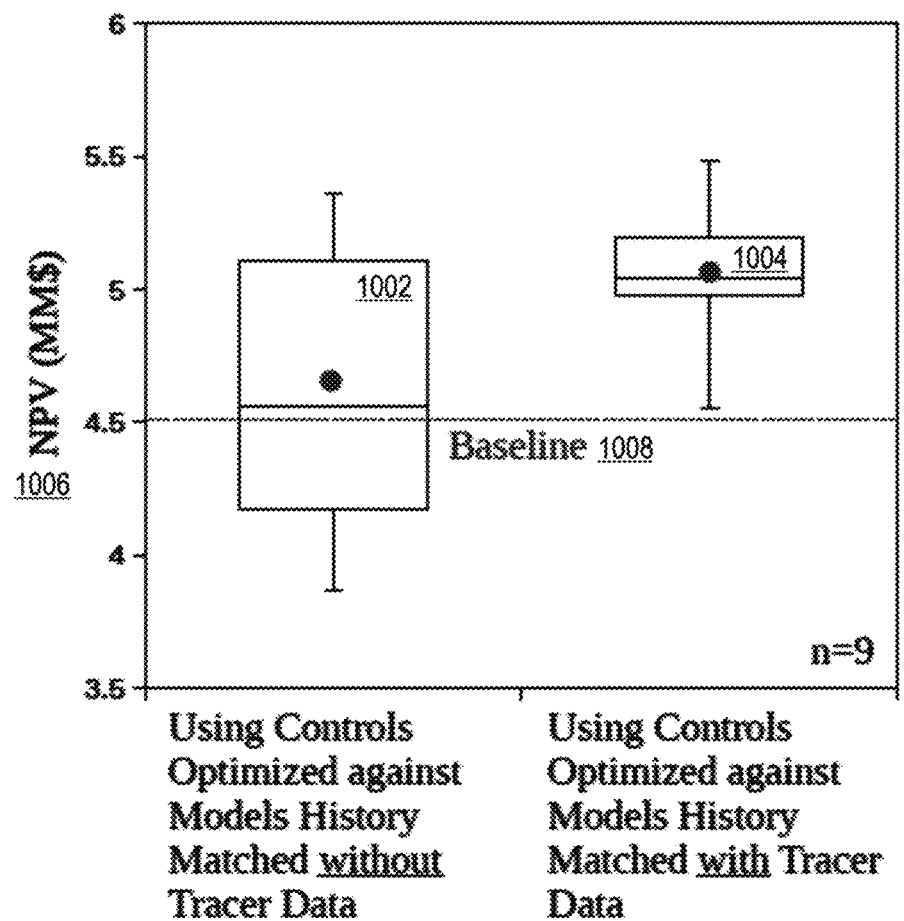
FIG. 10 illustrates an example box plot of the virtual "real" NPV produced from the different control parameters, according to an implementation of the present disclosure.

FIG. 10 illustrates an example box plot 1000 of the virtual "real" NPV produced from the different control parameters, according to an implementation of the present disclosure. The NPV can be calculated from production data using control parameters optimized against geological models with or without tracer data. Plot 1002 represents the use of controls optimized against models history matched without tracer data. Plot 1004 represents the use of controls optimized against models history matched with tracer data. Both plots 1002 and 1004 indicate NPV values 1006 that exceed a baseline 1008. It can be seen that the NPV values 1006 from controls optimized from geological models history matched with tracer data (plot 1004) are significantly greater than the without tracer data cases (plot 1002).

In summary, this numerical example demonstrated the workflow and the validity for enhancing the reservoir production optimization by integrating inter-well tracer test data.

Figure 11:
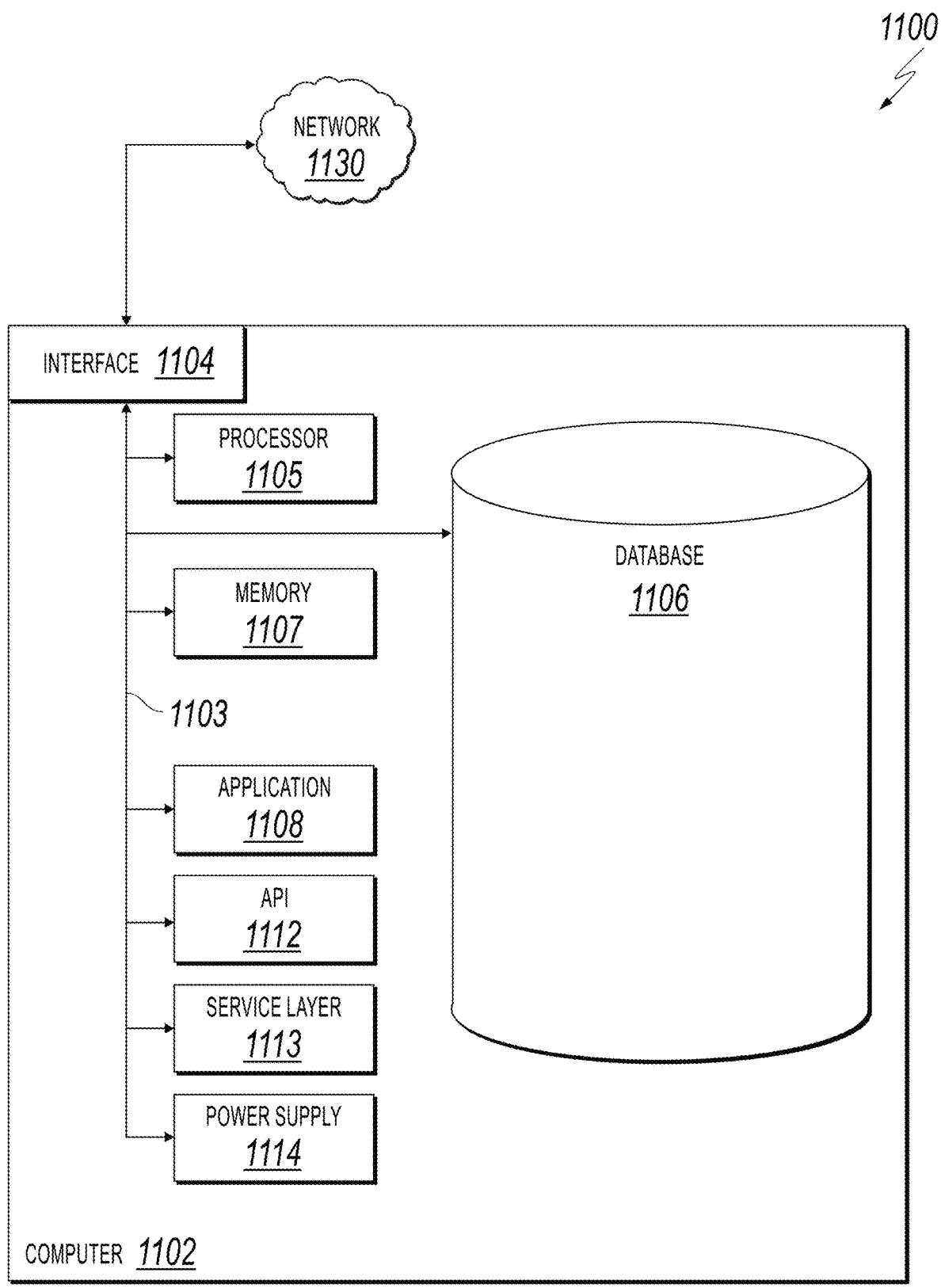
FIG. 11 is a block diagram illustrating an example of a computer system used to provide computational functionalities associated with described algorithms, methods, functions, processes, flows, and procedures as described in the instant disclosure, according to an implementation of the present disclosure.

FIG. 11 is a block diagram illustrating an example of a computer system 1100 used to provide computational functionalities associated with described algorithms, methods, functions, processes, flows, and procedures, according to an implementation of the present disclosure. The illustrated computer 1102 is intended to encompass any computing device, such as a server, desktop computer, laptop/notebook computer, wireless data port, smart phone, personal data assistant (PDA), tablet computing device, one or more processors within these devices, another computing device, or a combination of computing devices, including physical or virtual instances of the computing device, or a combination of physical or virtual instances of the computing device. Additionally, the computer 1102 can comprise a computer that includes an input device, such as a keypad, keyboard, touch screen, another input device, or a combination of input devices that can accept user information, and an output device that conveys information associated with the operation of the computer 1102, including digital data, visual, audio, another type of information, or a combination of types of information, on a graphical-type user interface (UI) (or GUI) or other UI.

The computer 1102 can serve in a role in a computer system as a client, network component, a server, a database or another persistency, another role, or a combination of roles for performing the subject matter described in the present disclosure. The illustrated computer 1102 is communicably coupled with a network 1130. In some implementations, one or more components of the computer 1102 can be configured to operate within an environment, including cloud-computing-based, local, global, another environment, or a combination of environments.

At a high level, the computer 1102 is an electronic computing device operable to receive, transmit, process, store, or manage data and information associated with the described subject matter. According to some implementations, the computer 1102 can also include or be communicably coupled with a server, including an application server, e-mail server, web server, caching server, streaming data server, another server, or a combination of servers.

The computer 1102 can receive requests over network 1130 (for example, from a client software application executing on another computer 1102) and respond to the received requests by processing the received requests using a software application or a combination of software applications. In addition, requests can also be sent to the computer 1102 from internal users (for example, from a command console or by another internal access method), external or third-parties, or other entities, individuals, systems, or computers.

Each of the components of the computer 1102 can communicate using a system bus 1103. In some implementations, any or all of the components of the computer 1102, including hardware, software, or a combination of hardware and software, can interface over the system bus 1103 using an application programming interface (API) 1112, a service layer 1113, or a combination of the API 1112 and service layer 1113. The API 1112 can include specifications for routines, data structures, and object classes. The API 1112 can be either computer-language independent or dependent and refer to a complete interface, a single function, or even a set of APIs. The service layer 1113 provides software services to the computer 1102 or other components (whether illustrated or not) that are communicably coupled to the computer 1102. The functionality of the computer 1102 can be accessible for all service consumers using this service layer. Software services, such as those provided by the service layer 1113, provide reusable, defined functionalities through a defined interface. For example, the interface can be software written in JAVA, C++, another computing language, or a combination of computing languages providing data in extensible markup language (XML) format, another format, or a combination of formats. While illustrated as an integrated component of the computer 1102, alternative implementations can illustrate the API 1112 or the service layer 1113 as stand-alone components in relation to other components of the computer 1102 or other components (whether illustrated or not) that are communicably coupled to the computer 1102. Moreover, any or all parts of the API 1112 or the service layer 1113 can be implemented as a child or a sub-module of another software module, enterprise application, or hardware module without departing from the scope of the present disclosure.

The computer 1102 includes an interface 1104. Although illustrated as a single interface 1104 in FIG. 11, two or more interfaces 1104 can be used according to particular needs, desires, or particular implementations of the computer 1102. The interface 1104 is used by the computer 1102 for communicating with another computing system (whether illustrated or not) that is communicatively linked to the network 1130 in a distributed environment. Generally, the interface 1104 is operable to communicate with the network 1130 and comprises logic encoded in software, hardware, or a combination of software and hardware. More specifically, the interface 1104 can comprise software supporting one or more communication protocols associated with communications such that the network 1130 or interface's hardware is operable to communicate physical signals within and outside of the illustrated computer 1102.

The computer 1102 includes a processor 1105. Although illustrated as a single processor 1105 in FIG. 11, two or more processors can be used according to particular needs, desires, or particular implementations of the computer 1102. Generally, the processor 1105 executes instructions and manipulates data to perform the operations of the computer 1102 and any algorithms, methods, functions, processes, flows, and procedures as described in the present disclosure.

The computer 1102 also includes a database 1106 that can hold data for the computer 1102, another component communicatively linked to the network 1130 (whether illustrated or not), or a combination of the computer 1102 and another component. For example, database 1106 can be an in-memory, conventional, or another type of database storing data consistent with the present disclosure. In some implementations, database 1106 can be a combination of two or more different database types (for example, a hybrid in-memory and conventional database) according to particular needs, desires, or particular implementations of the computer 1102 and the described functionality. Although illustrated as a single database 1106 in FIG. 11, two or more databases of similar or differing types can be used according to particular needs, desires, or particular implementations of the computer 1102 and the described functionality. While database 1106 is illustrated as an integral component of the computer 1102, in alternative implementations, database 1106 can be external to the computer 1102.

The computer 1102 also includes a memory 1107 that can hold data for the computer 1102, another component or components communicatively linked to the network 1130 (whether illustrated or not), or a combination of the computer 1102 and another component. Memory 1107 can store any data consistent with the present disclosure. In some implementations, memory 1107 can be a combination of two or more different types of memory (for example, a combination of semiconductor and magnetic storage) according to particular needs, desires, or particular implementations of the computer 1102 and the described functionality. Although illustrated as a single memory 1107 in FIG. 11, two or more memories 1107 or similar or differing types can be used according to particular needs, desires, or particular implementations of the computer 1102 and the described functionality. While memory 1107 is illustrated as an integral component of the computer 1102, in alternative implementations, memory 1107 can be external to the computer 1102.

The application 1108 is an algorithmic software engine providing functionality according to particular needs, desires, or particular implementations of the computer 1102, particularly with respect to functionality described in the present disclosure. For example, application 1108 can serve as one or more components, modules, or applications. Further, although illustrated as a single application 1108, the application 1108 can be implemented as multiple applications 1108 on the computer 1102. In addition, although illustrated as integral to the computer 1102, in alternative implementations, the application 1108 can be external to the computer 1102.

The computer 1102 can also include a power supply 1114. The power supply 1114 can include a rechargeable or non-rechargeable battery that can be configured to be either user- or non-user-replaceable. In some implementations, the power supply 1114 can include power-conversion or management circuits (including recharging, standby, or another power management functionality). In some implementations, the power-supply 1114 can include a power plug to allow the computer 1102 to be plugged into a wall socket or another power source to, for example, power the computer 1102 or recharge a rechargeable battery. There can be any number of computers 1102 associated with, or external to, a computer system containing computer 1102, each computer 1102 communicating over network 1130. Further, the term "client," "user," or other appropriate terminology can be used interchangeably, as appropriate, without departing from the scope of the present disclosure. Moreover, the present disclosure contemplates that many users can use one computer 1102, or that one user can use multiple computers 1102.

Described implementations of the subject matter can include one or more features, alone or in combination.

For example, in a first implementation, a computer-implemented method comprises: obtaining historical production data associated with production of a hydrocarbon product in a reservoir; obtaining historical tracer test data associated with the production; performing history matching using the historical production data and the historical tracer test data to generate improved geological models; performing production optimization using the improved geological models, including predicting optimized controls and updating, using the predicted optimized controls, water injection rates and fluid production rates for individual injectors and producers; and applying the predicted optimized controls to the reservoir to optimize future production.

The foregoing and other described implementations can each, optionally, include one or more of the following features:

A first feature, combinable with any of the following features, the computer-implemented method further comprises performing a tracer test to generate the historical tracer test data when historical tracer test data is not available.

A second feature, combinable with any of the previous or following features, the tracer test is performed using chemicals that are injected in the injection wells and based on chemicals produced from producing wells.

A third feature, combinable with any of the previous or following features, the hydrocarbon product is oil.

A fourth feature, combinable with any of the previous or following features, performing the history matching includes adjusting reservoir models until the reservoir models more closely reproduce the past behavior of a reservoir.

A fifth feature, combinable with any of the previous or following features, the reservoir models include reservoir porosity distributions, permeability distributions, fracture distributions, interactions with aquafers, and physical properties of oil, gas, and water.

A sixth feature, combinable with any of the previous or following features, the hydrocarbon product is gas.

A seventh feature, combinable with any of the previous or following features, the production optimization include the process of adjusting production control parameters to achieve production objectives selected from the group consisting of the highest total oil recovery, the highest net present value (NPV), and the lowest water injection.

An eighth feature, combinable with any of the previous or following features, the chemicals are selected from the group consisting of ions, small molecules, macromolecules, and nanomaterials.

In a second implementation, a non-transitory, computer-readable medium storing one or more instructions executable by a computer system to perform operations comprises: obtaining historical production data associated with production of a hydrocarbon product in a reservoir; obtaining historical tracer test data associated with the production; performing history matching using the historical production data and the historical tracer test data to generate improved geological models; performing production optimization using the improved geological models, including predicting optimized controls and updating, using the predicted optimized controls, water injection rates and fluid production rates for individual injectors and producers; and applying the predicted optimized controls to the reservoir to optimize future production.

The foregoing and other described implementations can each, optionally, include one or more of the following features:

A first feature, combinable with any of the following features, the operations further comprise performing a tracer test to generate the historical tracer test data when historical tracer test data is not available.

A second feature, combinable with any of the previous or following features, the tracer test is performed using chemicals that are injected in the injection wells and based on chemicals produced from producing wells.

A third feature, combinable with any of the previous or following features, the hydrocarbon product is oil.

A fourth feature, combinable with any of the previous or following features, performing the history matching includes adjusting reservoir models until the reservoir models more closely reproduce the past behavior of a reservoir.

A fifth feature, combinable with any of the previous or following features, the reservoir models include reservoir porosity distributions, permeability distributions, fracture distributions, interactions with aquafers, and physical properties of oil, gas, and water.

In a third implementation, a computer-implemented system comprises: one or more computers; and one or more computer memory devices interoperably coupled with the one or more computers and having tangible, non-transitory, machine-readable media storing instructions that, when executed by the one or more computers, perform operations comprising: obtaining historical production data associated with production of a hydrocarbon product in a reservoir; obtaining historical tracer test data associated with the production; performing history matching using the historical production data and the historical tracer test data to generate improved geological models; performing production optimization using the improved geological models, including predicting optimized controls and updating, using the predicted optimized controls, water injection rates and fluid production rates for individual injectors and producers; and applying the predicted optimized controls to the reservoir to optimize future production.

The foregoing and other described implementations can each, optionally, include one or more of the following features:

A first feature, combinable with any of the following features, the operations further comprise performing a tracer test to generate the historical tracer test data when historical tracer test data is not available.

A second feature, combinable with any of the previous or following features, the tracer test is performed using chemicals that are injected in the injection wells and based on chemicals produced from producing wells.

A third feature, combinable with any of the previous or following features, the hydrocarbon product is oil.

A fourth feature, combinable with any of the previous or following features, performing the history matching includes adjusting reservoir models until the reservoir models more closely reproduce the past behavior of a reservoir.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to a receiver apparatus for execution by a data processing apparatus. The computer-storage medium can be a machine-readable storage device, a machine-readable storage substrate, a random or serial access memory device, or a combination of computer-storage mediums. Configuring one or more computers means that the one or more computers have installed hardware, firmware, or software (or combinations of hardware, firmware, and software) so that when the software is executed by the one or more computers, particular computing operations are performed.

The term "real-time," "real time," "realtime," "real (fast) time (RFT)," "near(ly) real-time (NRT)," "quasi real-time," or similar terms (as understood by one of ordinary skill in the art), means that an action and a response are temporally proximate such that an individual perceives the action and the response occurring nearly simultaneously. For example, the time difference for a response to display (or for an initiation of a display) of data following the individual's action to access the data can be less than 1 millisecond (ms), less than 1 second (s), or less than 5 seconds. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be, or further include special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with an operating system of some type, for example LINUX, UNIX, WINDOWS, MAC OS, ANDROID, IOS, another operating system, or a combination of operating systems.

A computer program, which can also be referred to or described as a program, software, a software application, a unit, a module, a software module, a script, code, or other component can be written in any form of programming language, including compiled or interpreted languages, or declarative or procedural languages, and it can be deployed in any form, including, for example, as a stand-alone program, module, component, or subroutine, for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network.

While portions of the programs illustrated in the various figures can be illustrated as individual components, such as units or modules, that implement described features and functionality using various objects, methods, or other processes, the programs can instead include a number of sub-units, sub-modules, third-party services, components, libraries, and other components, as appropriate. Conversely, the features and functionality of various components can be combined into single components, as appropriate. Thresholds used to make computational determinations can be statically, dynamically, or both statically and dynamically determined.

Described methods, processes, or logic flows represent one or more examples of functionality consistent with the present disclosure and are not intended to limit the disclosure to the described or illustrated implementations, but to be accorded the widest scope consistent with described principles and features. The described methods, processes, or logic flows can be performed by one or more programmable computers executing one or more computer programs to perform functions by operating on input data and generating output data. The methods, processes, or logic flows can also be performed by, and apparatus can also be implemented as, special purpose logic circuitry, for example, a CPU, an FPGA, or an ASIC.

Computers for the execution of a computer program can be based on general or special purpose microprocessors, both, or another type of CPU. Generally, a CPU will receive instructions and data from and write to a memory. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable memory storage device.

Non-transitory computer-readable media for storing computer program instructions and data can include all forms of permanent/non-permanent or volatile/non-volatile memory, media and memory devices, including by way of example semiconductor memory devices, for example, random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices; magnetic devices, for example, tape, cartridges, cassettes, internal/removable disks; magneto-optical disks; and optical memory devices, for example, digital video disc (DVD), compact disc read-only memory (CD-ROM), DVD+/–R, DVD-RAM, DVD-ROM, high definition digital video disc (HD-DVD), and BLURAY, and other optical memory technologies. The memory can store various objects or data, including caches, classes, frameworks, applications, modules, backup data, jobs, web pages, web page templates, data structures, database tables, repositories storing dynamic information, or other appropriate information including any parameters, variables, algorithms, instructions, rules, constraints, or references. Additionally, the memory can include other appropriate data, such as logs, policies, security or access data, or reporting files. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input can also be provided to the computer using a touchscreen, such as a tablet computer surface with pressure sensitivity, a multi-touch screen using capacitive or electric sensing, or another type of touchscreen. Other types of devices can be used to interact with the user. For example, feedback provided to the user can be any form of sensory feedback (such as, visual, auditory, tactile, or a combination of feedback types). Input from the user can be received in any form, including acoustic, speech, or tactile input. In addition, a computer can interact with the user by sending documents to and receiving documents from a client computing device that is used by the user (for example, by sending web pages to a web browser on a user's mobile computing device in response to requests received from the web browser).

The term "graphical user interface," or "GUI," can be used in the singular or the plural to describe one or more graphical user interfaces and each of the displays of a particular graphical user interface. Therefore, a GUI can represent any graphical user interface, including but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with the present disclosure), all or a portion of the Internet, another communication network, or a combination of communication networks. The communication network can communicate with, for example, Internet Protocol (IP) packets, Frame Relay frames, Asynchronous Transfer Mode (ATM) cells, voice, video, data, or other information between network nodes.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or on the scope of what can be claimed, but rather as descriptions of features that can be specific to particular implementations of particular inventions. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features can be described as acting in certain combinations and even initially claimed as such, one or more features from a claimed combination can, in some cases, be excised from the combination, and the claimed combination can be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations can be considered optional), to achieve desirable results. In certain circumstances, multitasking or parallel processing (or a combination of multitasking and parallel processing) can be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A method for controlling hydrocarbon production in a reservoir, comprising:

obtaining historical production data associated with production of a hydrocarbon product in the reservoir;

obtaining historical tracer test data associated with the production;

performing history matching using the historical production data and the historical tracer test data to generate improved geological models, wherein performing history matching comprises generating a plurality of analyzed vectors, each of the plurality of analyzed vectors is generated based on a historical oil production rate, a historical water production rate, and a tracer concentration value, and wherein the analyzed vectors $m^a$ are represented by the following equation:

$m_j^a = m_j^f + C_{MD}^f (C_{DD}^f + \alpha_i C_D)^{-1} (d_{uc,j} - d_j^f)$, wherein $j=1,2,\ldots,N_e$, $N_e$ denotes a number of the analyzed vectors, $C_{MD}^f$ represents a cross-covariance matrix between a prior vector $m^f$ and a vector of predicted data $d^f$, $C_{DD}^f$ represents a $N_d \times N_d$ auto-covariance matrix of the predicted data, $N_d$ denotes a number of measurements assimilated, $d_{uc} \sim N(d_{obs}, C_D)$ is a vector of perturbed observations, $d_{obs}$ denotes observed data, $C_D$ denotes a user defined $N_d \times N_d$ auto-covariance matrix of observed data measurement errors, $\alpha_i (i=1,2,\ldots,N_a)$ represent predefined inflation coefficients that satisfy $$\sum_{i=1}^{N_a} \frac{1}{\alpha_i} = 1,$$

and $N_a$ denotes a number of data assimilation iterations;

performing production optimization using the improved geological models, wherein performing production optimization comprises:

predicting optimized controls; and updating, using the predicted optimized controls, water injection rates and fluid production rates for individual injectors and producers in the reservoir; and applying the predicted optimized controls to the reservoir to optimize future production, wherein applying the predicted optimized controls comprises controlling the individual injectors and producers to inject water and produce fluids in a well located at the reservoir by using the updated water injection rates and fluid production rates.

2. The method of claim 1, further comprising performing a tracer test to generate the historical tracer test data when historical tracer test data is not available.

3. The method of claim 2, wherein the tracer test is performed using chemicals that are injected in injection wells and based on chemicals produced from producing wells.

4. The method of claim 1, wherein the hydrocarbon product is oil.

5. The method of claim 1, wherein performing the history matching includes adjusting reservoir models until the reservoir models more closely reproduce a past behavior of a reservoir.

6. The method of claim 5, wherein the reservoir models include reservoir porosity distributions, permeability distributions, fracture distributions, interactions with aquafers, and physical properties of oil, gas, and water.

7. The method of claim 1, wherein the hydrocarbon product is gas.

8. The method of claim 1, wherein the production optimization include a process of adjusting production control parameters to achieve production objectives selected from the group consisting of the highest total oil recovery, the highest net present value (NPV), and the lowest water injection.

9. The method of claim 3, wherein the chemicals are selected from the group consisting of ions, small molecules, macromolecules, and nanomaterials.

10. A non-transitory, computer-readable medium storing one or more instructions executable by a computer system to perform operations comprising:
obtaining historical production data associated with production of a hydrocarbon product in a reservoir;
obtaining historical tracer test data associated with the production;
performing history matching using the historical production data and the historical tracer test data to generate improved geological models, wherein performing history matching comprises generating a plurality of analyzed vectors, each of the plurality of analyzed vectors is generated based on a historical oil production rate, a historical water production rate, and a tracer concentration value, and wherein the analyzed vectors $m^a$ are represented by the following equation:
$m_j^a = m_j^f + C_{MD}^f(C_{DD}^f + \alpha_i C_D)^{-1}(d_{uc,j} - d_j^f)$, wherein $j=1,2,\ldots,N_e$, $N_e$ denotes a number of the analyzed vectors, $C_{MD}^f$ represents a cross-covariance matrix between a prior vector $m^f$ and a vector of predicted data $d^f$, $C_{DD}^f$ represents a $N_d \times N_d$ auto-covariance matrix of the predicted data, $N_d$ denotes a number of measurements assimilated, $d_{uc} \sim N(d_{obs}, C_D)$ is a vector of perturbed observations, $d_{obs}$ denotes observed data, $C_D$ denotes a user defined $N_d \times N_d$ auto-covariance matrix of observed data measurement errors, $\alpha_i(i=1,2,\ldots,N_a)$ represent predefined inflation coefficients that satisfy $$\sum_{i=1}^{N_a} \frac{1}{\alpha_i} = 1,$$

and $N_a$ denotes a number of data assimilation iterations;
performing production optimization using the improved geological models, wherein performing production optimization comprises:
predicting optimized controls; and
updating, using the predicted optimized controls, water injection rates and fluid production rates for individual injectors and producers in the reservoir; and
applying the predicted optimized controls to the reservoir to optimize future production, wherein applying the predicted optimized controls comprises controlling the individual injectors and producers to inject water and produce fluids in a well located at the reservoir by using the updated water injection rates and fluid production rates.

11. The non-transitory, computer-readable medium of claim 10, the operations further comprising performing a tracer test to generate the historical tracer test data when historical tracer test data is not available.

12. The non-transitory, computer-readable medium of claim 11, wherein the tracer test is performed using chemicals that are injected in injection wells and based on chemicals produced from producing wells.

13. The non-transitory, computer-readable medium of claim 10, wherein the hydrocarbon product is oil.

14. The non-transitory, computer-readable medium of claim 10, wherein performing the history matching includes adjusting reservoir models until the reservoir models more closely reproduce a past behavior of a reservoir.

15. The non-transitory, computer-readable medium of claim 14, wherein the reservoir models include reservoir porosity distributions, permeability distributions, fracture distributions, interactions with aquafers, and physical properties of oil, gas, and water.

16. A system, comprising:
one or more computers; and
one or more computer memory devices interoperably coupled with the one or more computers and having tangible, non-transitory, machine-readable media storing instructions that, when executed by the one or more computers, perform operations comprising:
obtaining historical production data associated with production of a hydrocarbon product in a reservoir;
obtaining historical tracer test data associated with the production;
performing history matching using the historical production data and the historical tracer test data to generate improved geological models, wherein performing history matching comprises generating a plurality of analyzed vectors, each of the plurality of analyzed vectors is generated based on a historical oil production rate, a historical water production rate, and a tracer concentration value, and wherein the analyzed vectors $m^a$ are represented by the following equation:
$m_j^a = m_j^f + C_{MD}^f(C_{DD}^f + \alpha_i C_D)^{-1}(d_{uc,j} - d_j^f)$, wherein $j=1,2,\ldots,N_e$, $N_e$ denotes a number of the analyzed vectors, $C_{MD}^f$ represents a cross-covariance matrix between a prior vector $m^f$ and a vector of predicted data $d^f$, $C_{DD}^f$ represents a $N_d \times N_d$ auto-covariance matrix of the predicted data, $N_d$ denotes a number of measurements assimilated, $d_{uc} \sim N(d_{obs}, C_D)$ is a vector of perturbed observations, $d_{obs}$ denotes observed data, $C_D$ denotes a user defined $N_d \times N_d$ auto-covariance matrix of observed data measurement errors, $\alpha_i(i=1,2,\ldots,N_a)$ represent predefined inflation coefficients that satisfy $$\sum_{i=1}^{N_a} \frac{1}{\alpha_i} = 1,$$

and $N_a$ denotes a number of data assimilation iterations;

performing production optimization using the improved geological models, wherein performing production optimization comprises:
predicting optimized controls; and
updating, using the predicted optimized controls, water injection rates and fluid production rates for individual injectors and producers in the reservoir; and
applying the predicted optimized controls to the reservoir to optimize future production, wherein applying the predicted optimized controls comprises controlling the individual injectors and producers to inject water and produce fluids in a well located at the reservoir by using the updated water injection rates and fluid production rates.

17. The system of claim 16, the operations further comprising performing a tracer test to generate the historical tracer test data when historical tracer test data is not available.

18. The system of claim 16, wherein the tracer test is performed using chemicals that are injected in injection wells and based on chemicals produced from producing wells.

19. The system of claim 16, wherein the hydrocarbon product is oil.

20. The system of claim 16, wherein performing the history matching includes adjusting reservoir models until the reservoir models more closely reproduce a past behavior of a reservoir.

* * * * *